US008193494B2

(12) United States Patent
Harada et al.

(10) Patent No.: US 8,193,494 B2
(45) Date of Patent: Jun. 5, 2012

(54) TRANSMISSION ELECTRON MICROSCOPE AND METHOD FOR OBSERVING SPECIMEN IMAGE WITH THE SAME

(75) Inventors: Ken Harada, Fuchu (JP); Akira Sugawara, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 126 days.

(21) Appl. No.: 12/850,961

(22) Filed: Aug. 5, 2010

(65) Prior Publication Data

US 2011/0031395 A1 Feb. 10, 2011

(30) Foreign Application Priority Data

Aug. 7, 2009 (JP) ................................. 2009-184998

(51) Int. Cl.
*H01J 37/26* (2006.01)
*H01J 37/04* (2006.01)
*G01B 15/00* (2006.01)
(52) U.S. Cl. ........ 250/311; 250/306; 250/307; 250/310; 250/397; 250/492.2; 250/492.3
(58) Field of Classification Search .................. 250/311, 250/306, 307, 310, 397, 492.2, 492.3
See application file for complete search history.

(56) References Cited

U.S. PATENT DOCUMENTS

| 7,012,253 | B2 | 3/2006 | Tanji |
| 7,417,227 | B2 * | 8/2008 | Matsumoto et al. .......... 250/311 |
| 7,538,323 | B2 | 5/2009 | Harada et al. |
| 7,750,298 | B2 * | 7/2010 | Harada et al. .................. 250/311 |
| 7,816,648 | B2 * | 10/2010 | Harada et al. .................. 250/311 |
| 7,872,755 | B2 * | 1/2011 | Harada et al. .................. 356/450 |
| 7,923,685 | B2 * | 4/2011 | Harada et al. .................. 250/310 |
| 2008/0258058 | A1 | 10/2008 | Harada et al. |

FOREIGN PATENT DOCUMENTS

| JP | 06-310070 | 11/1994 |
| JP | 2004-171922 | 6/2004 |
| JP | 2005-197165 | 7/2005 |
| JP | 2006-313069 | 11/2006 |
| JP | 2008-270056 | 11/2008 |

OTHER PUBLICATIONS

Kousuke Kimura et al., Dark-field transmission electron microscopy for a tilt series of ordering alloy: toward electron tomography, Journal of Electron Microscopy, 2005, pp. 373-377, vol. 54, No. 4.

* cited by examiner

*Primary Examiner* — Nikita Wells
(74) *Attorney, Agent, or Firm* — Antonelli, Terry, Stout & Kraus, LLP.

(57) ABSTRACT

A first electron biprism is disposed in a condenser optical system and an observation region of a specimen is irradiated simultaneously with two electron beams of different angles. The two electron beams that have simultaneously transmitted the specimen are spatially separated and focused with a second electron biprism disposed in an imaging optical system and two electron microscopic images of different irradiation angles are obtained. The two picture images are obtained by a detecting unit. Based on the two picture images, a stereoscopic image or two images having different kinds of information of the specimen is/are produced and displayed on a display device.

20 Claims, 21 Drawing Sheets

TRANSMISSION ELECTRON MICROSCOPE AND METHOD FOR OBSERVING SPECIMEN IMAGE WITH THE SAME

CLAIM OF PRIORITY

The present application claims priority from Japanese patent application JP 2009-184998 filed on Aug. 7, 2009, the content of which is hereby incorporated by reference into this application.

FIELD OF THE INVENTION

The present invention relates to a transmission electron microscope and a method for observing a specimen image with the transmission electron microscope.

BACKGROUND OF THE INVENTION

An electron beam has a strong interaction with a substance; and, in order to be used as a probe, must be accelerated at a high voltage and propagated in vacuum. For that reason: it is impossible to configure an optical system on an optical bench by using a three-dimensional space like a laser optical system; and the system is configured by one-dimensionally arraying a source (an electron source), a lens, a specimen, and an observation device in one vacuum chamber (one mirror body). Because of such a configuration, with a conventional electron microscope, it is very difficult to observe a specimen simultaneously from two directions and even an interference type electron microscope that requires two electron beams is handled within the range of an optical system configured one-dimensionally and an interference figure recorded as a result of interference is also one image at one time.

As three-dimensional observation or stereoscopic observation with such an electron microscope, tomography, a stereo method, confocal scanning imaging, or the like is adopted. The stereo method: is the oldest observation method and a method of obtaining two images (or two specimen images) by inclining a specimen to an electron beam at angles of several degrees in the plus and minus directions and sterically observing the specimen with a stereo viewer or the like; and is disclosed in Michio Kiritani, "Electron Microscope", Vol. 16, (1981) P 71-P 81 for example. In the stereo method, the two images of different inclination angles correspond to a right visual field image and a left visual field image respectively and the angle difference between the two images comes to be a parallactic angle.

Tomography is a method of, following recent development in image processing technology with a computer and computer control of specimen location/angle, obtaining a plurality of (several tens of) images while the specimen inclination angle is changed by several degrees in the range of ±70 degrees for example in an identical visual field, processing the obtained images with a computer, thereby reconstructing a three-dimensional structure in a prescribed visual region of the specimen in the computer, and making it possible to sterically observe the specimen from arbitrary directions. The tomography is disclosed in K. Kimura et al., J. Electron Microsc., Vol. 54(4), (2005) P 373-P 377 for example and it may be regarded as a technology developed from the stereo method with a high degree of accuracy.

The above methods do not depend on a method for obtaining a image and hence can be adopted not only in a transmission electron microscope but also in a scanning transmission electron microscope. Further, the stereo method: is also adopted in a scanning electron microscope the main observation object of which is the surface appearance of a specimen; and is disclosed in JP-A-Hei6 (1994)-310070 for example. In JP-A-Hei6 (1994)-310070, it is so designed as to observe a specimen from various angles by: deflecting an electron beam with a deflector or the like; switching between a vertical irradiation electron beam and an oblique irradiation electron beam; and alternately irradiating the specimen with the two beams. Likewise, the stereoscopic observation method of a specimen with a transmission electron microscope is disclosed also in JP-A-2004-171922. JP-A-2004-171922 discloses a method of reconstructing a sterical shape and displaying the sterical shape on a monitor by: alternately separating a first electron beam and a second electron beam deflected to different angles from an electron beam generated from an electron beam source by switching the polarity of voltage applied to an electron trapezoid prism; irradiating a specimen alternately with the first and second electron beams; and thereby taking a first image and a second image.

The confocal scanning imaging is a kind of the scanning transmission electron microscope and a method of obtaining the three-dimensional structure of a specimen from a plurality of images taken by changing the observation plane in the optical axis direction by: reducing the convergence portion of an electron beam in the optical axis direction with the electron beam of a large irradiation angle; and producing a two-dimensional image of a shallow field depth with a small-diameter stop in an imaging system. The confocal scanning imaging is disclosed in JP-A-2008-270056 for example.

Meanwhile, an interferometer equipped with a two-stage biprism having a structure wherein an electron biprism on the upper stage is disposed on the downstream side of a specimen and an electron biprism on the lower stage is disposed in a space at the shadow of the upper-stage electron biprism is disclosed in JP-A-2005-197165.

Then, an example of an interferometer using a quadrangular-pyramid electron beam prism in a condenser optical system is disclosed in FIG. 15 of JP-A-2006-313069.

SUMMARY OF THE INVENTION

In a conventional electron microscope, it has been difficult to observe a specimen from a plurality of directions at a time. Consequently, as methods for obtaining a three-dimensional shape of a specimen for example, there are: a tomography method of inclining a specimen at various angles and reconstructing a three-dimensional shape from the obtained images; a stereo method of producing two images corresponding to a right visual field image and a left visual field image by inclining a specimen or changing the irradiation angle of an electron beam and thereby making stereoscopic observation possible; in a scanning confocal optical system, a method of obtaining a three-dimensional shape of a specimen from a plurality of scanned images obtained by changing the relative positional relationship between an irradiation spot (a convergence portion) of an electron beam and the specimen in the optical axis direction; and other methods.

The above methods are inappropriate for dynamic observation and real-time observation however because, in any of the methods, a plurality of images are taken in sequence and thus the time required for obtaining the images is long. That is, any of the methods requires image obtaining operations corresponding to the number of the images in order to obtain the plural images, the time resolution is low, and dynamic observation and real-time observation have not been successful.

In order to redeem the above drawbacks, in the stereo method, a method of obtaining two images for a short period of time by changing the irradiation angle of an electron beam instead of inclining a specimen is devised and disclosed in JP-A-2004-171922 for example.

Even by the method disclosed in JP-A-2004-171922 however, first and second images are obtained in sequence by alternately switching the polarity of applied voltage, deflecting an electron beam, thus separating first and second electron beams, and alternately irradiating a specimen. Consequently, the change and adjustment of a condenser optical system and synchronous operation with a detection system are required in obtaining the first and second images, namely the right and left visual field images, dynamic observation can be realized only within the required time, and the simultaneous obtainment of the right and left visual field images has not been attained.

A main object of the present invention is to provide: a transmission electron microscope that realizes the doubling of data quantity caused by the simultaneous obtainment of two kinds of observed images and the improvement of data accuracy and reliability caused by the doubling of data quantity; and a method for observing a specimen image with the transmission electron microscope.

A representative example of the present invention is as follows. That is, a transmission electron microscope according an aspect of to the present invention: is a transmission electron microscope equipped with a source for an electron beam, a condenser optical system for irradiating a specimen with an electron beam emitted from the source, a specimen holding unit for holding the specimen to be irradiated by the electron beam, an imaging lens system for focusing an image of the specimen, and at least one detecting unit for obtaining the image of the specimen formed by the imaging lens system; and is characterized in that the transmission electron microscope has a first electron biprism disposed on the upstream side of the location where the specimen is placed in the electron beam traveling direction on the optical axis of the electron beam and a second electron biprism disposed on the downstream side of the location where the specimen is placed in the electron beam traveling direction and in a space at the shadow of the electron beam produced with the first electron biprism on the optical axis of the electron beam, deflects the electron beam emitted from the source and separates the electron beam into a first electron beam and a second electron beam, with which a prescribed region of the specimen is irradiated from different angles, with the first electron biprism, deflects the first electron beam and the second electron beam having transmitted the specimen and spatially separately forms a first image of the specimen produced with the first electron beam and a second image of the specimen produced with the second electron beam with the second electron biprism, and obtains the first image and the second image by the detecting unit.

An aspect of the present invention makes it possible to: obtain plural observed images simultaneously in an identical region of a specimen; double the obtained information capacity; and improve the observation efficiency of an observer. That is, two images corresponding to simultaneously obtained right and left visual field images are based on the image formation of two electron beams having transmitted a specimen at a completely identical time and simultaneous observation is strictly realized. Consequently, the same dynamic observation and real-time observation as ordinary electron microscopic observation comes to be possible only with being restricted by the time resolution of a specimen image in a detection system.

DETAILED DESCRIPTION OF THE PREFERRED EMBODIMENTS

Figure 1A:
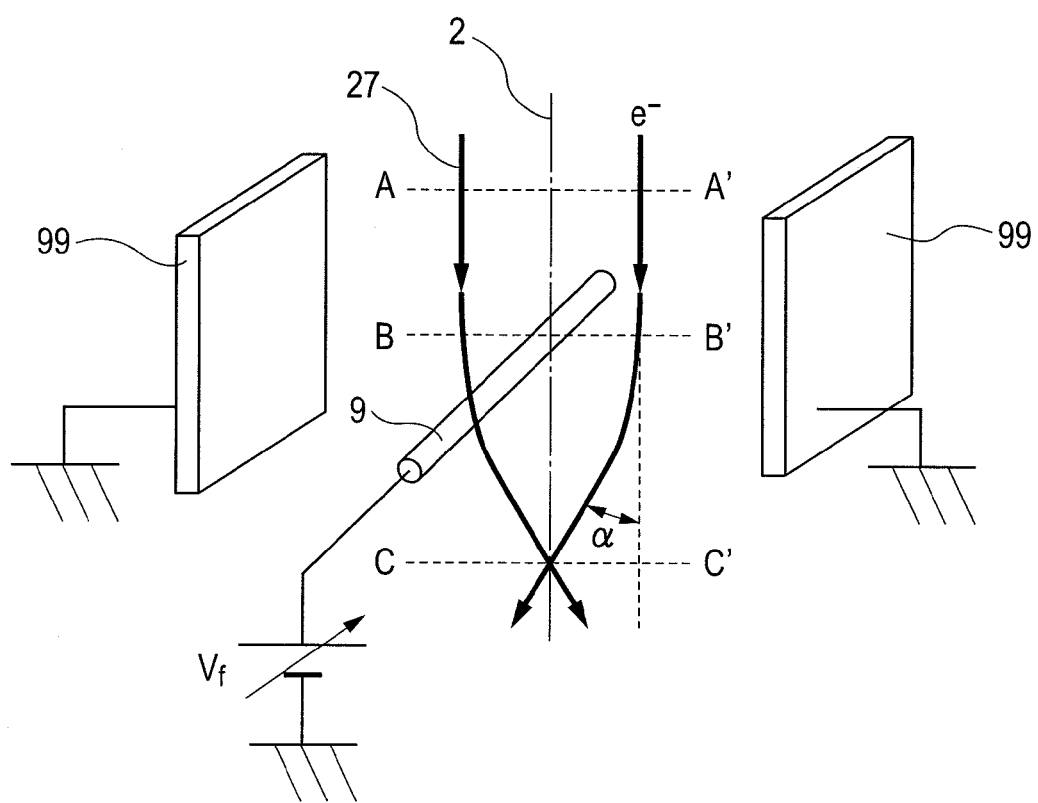
FIG. 1A is a schematic view showing the configuration of an electron biprism and the deflection of an electron beam with the electron biprism according to the present invention.

Firstly, the outline of the present invention is explained.

The present invention is established in order to make it possible to observe a specimen from a plurality of directions in a transmission electron microscope and also to realize dynamic observation and real-time observation in a stereoscopic observation method; and is characterized by real-time simultaneous obtainment of two images corresponding to a right visual field image and a left visual field image.

As the premise, the optical system of a transmission electron microscope has a condenser optical system for irradiating a specimen with an electron beam emitted from a source; and an imaging optical system (also called an imaging lens system or a magnifying imaging system) comprising an objective lens for focusing an image of the specimen irradiated by the electron beam in an observation region and a plurality of lenses.

In an exemplary embodiment according to the present invention, a first electron biprism is installed in a condenser optical system, two electron beams of different angles are produced, and a prescribed observation region of a specimen is irradiated simultaneously from different angles. The two electron beams having completely simultaneously transmitted the specimen are spatially separated with a second electron biprism disposed in an imaging optical system and individually focused on a detection plane (an observation record plane) and thereby two electron microscopic images of different irradiation angles corresponding to a right visual field image and a left visual field image are obtained simultaneously. Here, a detection plane to detect the two electron microscopic images by a detecting unit is hereunder referred to as an observation record plane for convenience sake and it goes without saying that not only the detection and record of a specimen image but also only the detection of a specimen image is carried out on the observation record plane in some cases.

By so doing, it comes to be possible to simultaneously obtain a plurality of observation images in an identical region, the amount of obtained information doubles, and an experimental efficiency improves. It will be explained more specifically hereunder.

Two images corresponding to a right visual field image and a left visual field image obtained by the aforementioned configuration are based on the images focused with the two electron beams having transmitted a specimen at a completely identical time and simultaneous observation is strictly realized. Consequently, the same dynamic observation and real-time observation as ordinary electron microscopic observation come to be possible only with being restricted by the time resolution of a specimen image in a detection system. Further, it is possible to realize: the doubling of data quantity or the improvement of timewise image resolution caused by simultaneous obtainment of two kinds of specimen images; the improvement of data accuracy and reliability caused by the complete identity of magnifying imaging conditions for the two images; and others.

Further, in the event of obtaining two specimen images corresponding to a right visual field image and a left visual field image, further change and readjustment of an optical system are not required and completely identical lenses and deflectors are used through an irradiation system and an image forming system, and hence disturbances such as noises imposed on obtained two specimen images including fluctuations of an induction magnetic field and a lens electric current are identical and artifact hardly occurs during image analysis. From the above facts, the present invention makes it possible to realize dynamic and real-time observation of a high degree of accuracy, a high resolution, and a high time resolution in the stereoscopic observation of a three-dimensional shape of a specimen.

Furthermore, since it is possible to observe a specimen from multiple directions in real time, it comes to be possible to realize real-time multiple observation of such a specimen as changing with the passage of time (a biological specimen for example). Further, it goes without saying that the dynamic and real-time observation of a high degree of accuracy and a high time resolution comes to be possible similarly in the case of a relatively thick biological specimen including a cell interior or a microstructure in a live body.

In a Lorentz microscopic method (a Foucault imaging) to observe a magnetic domain structure too, since electron beams deflected in two different directions in accordance with a magnetization state can be focused simultaneously and individually, magnetic domain structure observation of a higher degree of accuracy comes to be possible.

An electron biprism, an optical system, and an interference optical system which are constituent elements of the present invention are explained hereunder.

<Electron Biprism>

At least one electron biprism is required in each of a condenser optical system and an imaging optical system in order to separate and superimpose the propagation direction and the location of an electron beam. Firstly, an electron biprism is explained in reference to FIGS. 1A and 1B.

An electron biprism is a device in an electron-optical system functioning in the same way as a Fresnel's biprism in optics and has two types; an electric field type and a magnetic field type. In those types, the type that is widely prevalent is an electric field type electron biprism shown in FIG. 1A and the electric field type electron biprism comprises a filament electrode 9 in the center and a pair of parallel flat-plate type grounded electrodes 99 retained in parallel in the manner of interposing the electrode 9 and grounded. As shown in FIG. 1A for example, if a positive voltage $V_f$ is applied to the center ultrafine filament electrode 9 on an optical axis 2, an electron beam e⁻ passing through the vicinity of the center ultrafine filament electrode 9 is deflected in the directions of facing each other by the electric potential of the center ultrafine filament electrode 9 (refer to the orbit 27 of an electron beam).

Needless to say, in the configuration of an optical system, there is the case where a negative voltage is applied to a center ultrafine filament electrode 9 in an electron biprism and on this occasion an electron beam e⁻ passing through the vicinity of the center ultrafine filament electrode 9 is deflected in the directions of separating from each other.

An electron biprism installed in a condenser optical system has the function of separating an electron beam into two regions (a first electron beam 21 and a second electron beam 23).

Figure 1B:
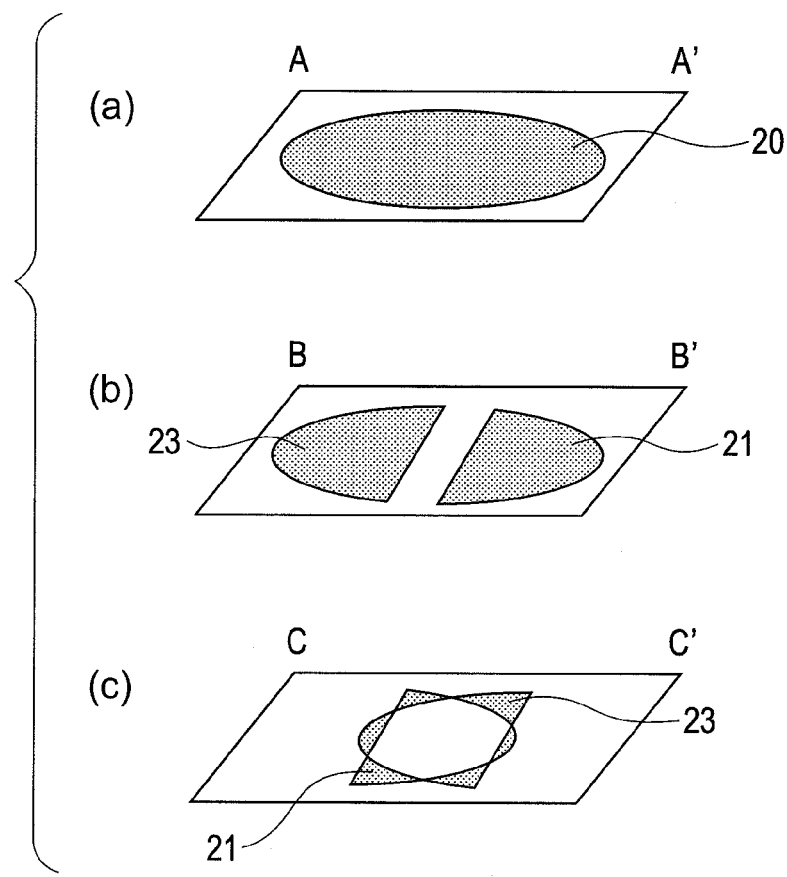
FIG. 1B comprises schematic views showing cross-sectional shapes of an electron beam at locations before and after the electron beam transmits the electron biprism shown in FIG. 1A.

Cross-sectional shapes of an electron beam at various locations in the electron beam traveling direction are shown in FIG. 1B. the cross-sectional shapes of an electron beam (the cross sections of an electron beam or irradiation regions, or simply electron beams) taken at the locations shown with the lines A-A', B-B', and C-C' in FIG. 1A are shown in (a) to (c) of FIG. 1B respectively. When the cross section (A-A') of an electron beam 20 emitted from a source is a circle, the circle is divided into bilaterally symmetrical two semicircular regions (a first electron beam 21 and a second electron beam 23) around the axis of a center ultrafine filament electrode 9 with the center ultrafine filament electrode 9 in an electron biprism as shown in the cross section (B-B') and, by the electron beams in the two regions being deflected in the directions of facing each other, an identical observation region on a specimen surface is irradiated completely simultaneously with the two semicircular regions (the first electron beam 21 and the second electron beam 23) in a superimposed manner as shown in the cross section (C-C').

In the present invention, an electron biprism installed in an imaging optical system has the function of spatially separating the electron beams 21 and 23 of two regions to locations apart from each other and not causing interference. The two electron beams (a right visual field electron beam 21 and a left visual field electron beam 23) obtained on the observation record plane of a specimen represent specimen permeation images obtained from the two electron beams having transmitted a specimen completely simultaneously, namely the two electron beams with which an identical observation region on the specimen surface is irradiated simultaneously in a superimposed manner.

Explanations are made hereunder in the case of using an electric field type electron biprism as an electron biprism. The present invention however: can be configured regardless of whether the electron biprism is an electric field type or a magnetic field type; and is not limited to the electric field type electron biprism used in the following explanations.

Here, as the distance between an electron beam and a center ultrafine filament electrode 9 increases, the electric potential acting on the electron beam reduces but, since the space range where the electric potential acts expands, resultantly the deflection angle of the electron beam is proportional to the voltage applied to the ultrafine filament electrode regardless of the incident position. That is, when α is defined as the deflection angle of an electron beam caused by an electron biprism, by using a voltage $V_f$ applied to a center ultrafine filament electrode 9 and a deflection factor k, simple relation represented by the expression $\alpha = kV_f$ comes to be true. The deflection factor k depends on the shape of the device such as the distance between the center ultrafine filament electrode 9 and the grounded electrodes 99 but in general, k: is at the level of about $2 \times 10^{-6}$ rad/V in the case of an electron microscope wherein an acceleration voltage is 100 to 300 kV; and comes to be an value of about one tenth (0.1° (0.001 rad)) of Bragg angle 1° in a crystal in the case where the voltage applied to the center ultrafine filament electrode is 500 V. The angle can be expanded or contracted in accordance with a condenser optical system and an irradiation angle difference of ±5° (±0.5 rad) can be produced.

<Optical System>

The present invention is characterized by, in an electron-optical system having only one optical axis of an electron microscope comprising one mirror body: producing two electron beams (a first electron beam and a second electron beam) of different irradiation angles; and, after transmitting a specimen, focusing and recording respective electron beams individually as different specimen images.

Figure 2:
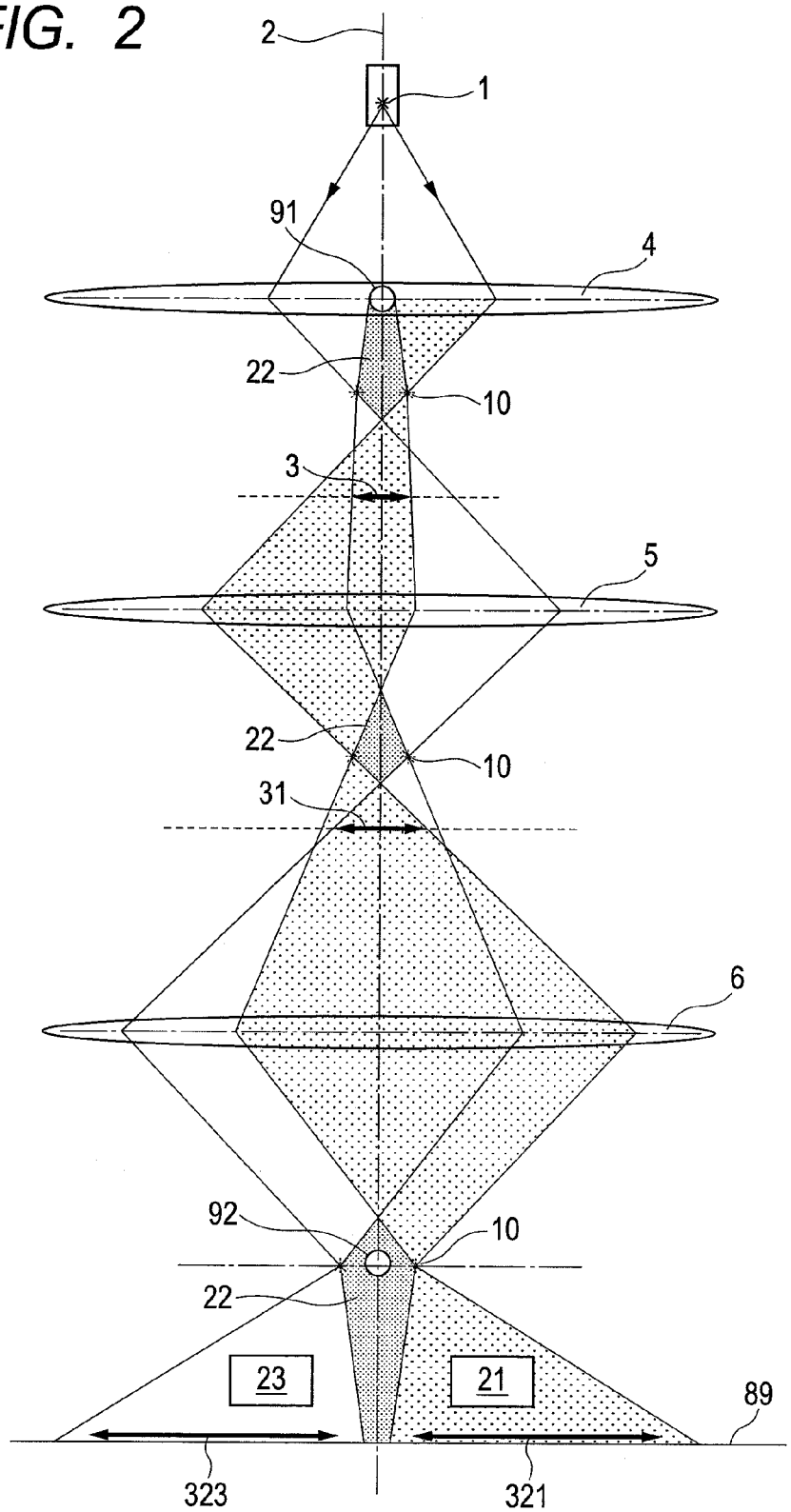
FIG. 2 is a schematic view of an optical system showing the principle of the present invention wherein an electron biprism in a condenser optical system is disposed on the principal plane of an irradiation lens.

A representative example of an optical system to which the present invention is applied is shown in FIG. 2. An electron beam emitted from an electron source 1 is adjusted with a condenser optical system (an irradiation lens 4) so as to take an appropriate electron density and an appropriate irradiation region when a specimen is irradiated. At the same time on this occasion, the irradiated electron beam is separated into two electron beams (a first electron beam 21 and a second electron beam 23) with a first electron biprism 91 disposed in the condenser optical system. Here, the region of the first electron beam 21 is represented by dots and distinguished from the region of the second electron beam 23.

The two electron beams 21 and 23 with which a prescribed region of a specimen 3 is irradiated from different angles are focused respectively with a magnifying imaging system. The reference numeral 31 shows an image of the specimen focused with an objective lens 5. The two electron beams 21 and 23 are, for example, spatially separated further with a second electron biprism 92 disposed in the vicinity of the image of the source (the real image of the source) 10 focused with an imaging lens 6; and focus images (a right visual field image 321 and a left visual field image 323 of the specimen) individually at locations spatially apart from each other on an observation record plane 89.

In the optical system shown in FIG. 2, for simplification, a device (an electron source or an electron gun) ranging to a condenser optical system such as an acceleration tube of an electron beam is omitted and is shown as the electron source 1, and the condenser optical system is also represented by a single-stage lens 4. In the magnifying imaging system too, in order to make the concept of the present invention understood easily, the objective lens 5 and the imaging lens 6 are drawn in the state of single stage respectively.

Further, with regard to two electron biprisms 91 and 92, each of the center ultrafine filament electrodes is represented only with a circle showing the cross-sectional shape and grounded electrodes are omitted.

Furthermore, with regard to an electron biprism, when a center ultrafine filament electrode is strictly indicated in an optical system, it is expressed as "the center ultrafine filament electrode of an electron biprism" and, when an electron biprism is commonly used as a deflector of an electron beam, it is expressed only as "an electron biprism", but the same reference numeral is used. The above expression is applied also to the figures and explanations succeeding to FIG. 2.

In the optical system shown in FIG. 2, the case where a first electron biprism 91 disposed in a condenser optical system is disposed on the principal plane of an irradiation lens 4 immediately above a specimen (on the upstream side in the electron beam traveling direction) is shown in the figure but, with regard to the installation location, plural cases are possible including above and below the irradiation lens 4. As an irradiation lens used, both a first irradiation lens on the upstream side and a second irradiation lens on the downstream side thereof can be used. From the possibilities of combination use with a condenser aperture and magnification or demagnification with the downstream side second irradiation lens, it is estimated that the use of the first irradiation lens on the upstream side is reasonable. It goes without saying however that the present invention is not limited to this configuration.

Meanwhile, a second electron biprism 92 disposed in a magnifying imaging system may be disposed in a space 22 at the shadow of an electron biprism disposed in a condenser optical system and a specific installation location may be decided in consideration of the mechanical positional configuration of an electron microscope. Such a configuration of allocating an electron biprism on the downstream side in a space at the shadow of an electron biprism on the upstream side as stated above is similar to the configuration of a two-stage biprism interferometer disclosed in JP-A-2005-197165. The electron biprism on the downstream side described in JP-A-2005-197165 however is different from the electron biprism 92 in the present invention on the point that the electron biprism described in JP-A-2005-197165 has the function of deflecting an electron beam so as to produce an interference figure on an observation plane.

Here, the location where the second electron biprism 92 is disposed may also be on the downstream side of an objective lens 5 and locations between an objective lens 5 and a first imaging lens, between a first imaging lens and a second imaging lens, and between a second imaging lens and a third imaging lens are envisaged. In any of the locations, necessary conditions are that: there is a space for installation in an electron microscope, which allows the second electron biprism 92 to be installed mechanically and spatially; and a center ultrafine filament electrode has a size that allows the center ultrafine filament electrode to be contained in a space 22 at the shadow of a first electron biprism.

In summary, a first electron biprism may be disposed at any location as long as the location is in a condenser optical system on the electron beam upstream side of the location where a specimen is placed on the optical axis 2 of an electron beam and a location between a lens constituting a condenser optical system and a specimen is also included. Further, a second electron biprism may be disposed at any location as long as the location is on the electron beam downstream side of the location where a specimen is placed and in a space at the shadow of an electron beam formed by a first electron biprism on the optical axis of the electron beam and locations between a lens constituting an imaging lens system and a specimen and between a lens constituting an imaging lens system and an observation plane are also included.

Here, as the second electron biprism, any electron biprism can be adopted as long as it has the function of spatially separating electron beams 21 and 23 from each other in two regions superimposed in an observation region and the polarity of the voltage applied to the center ultrafine filament electrode 9 is not limited to negative.

Figure 3:
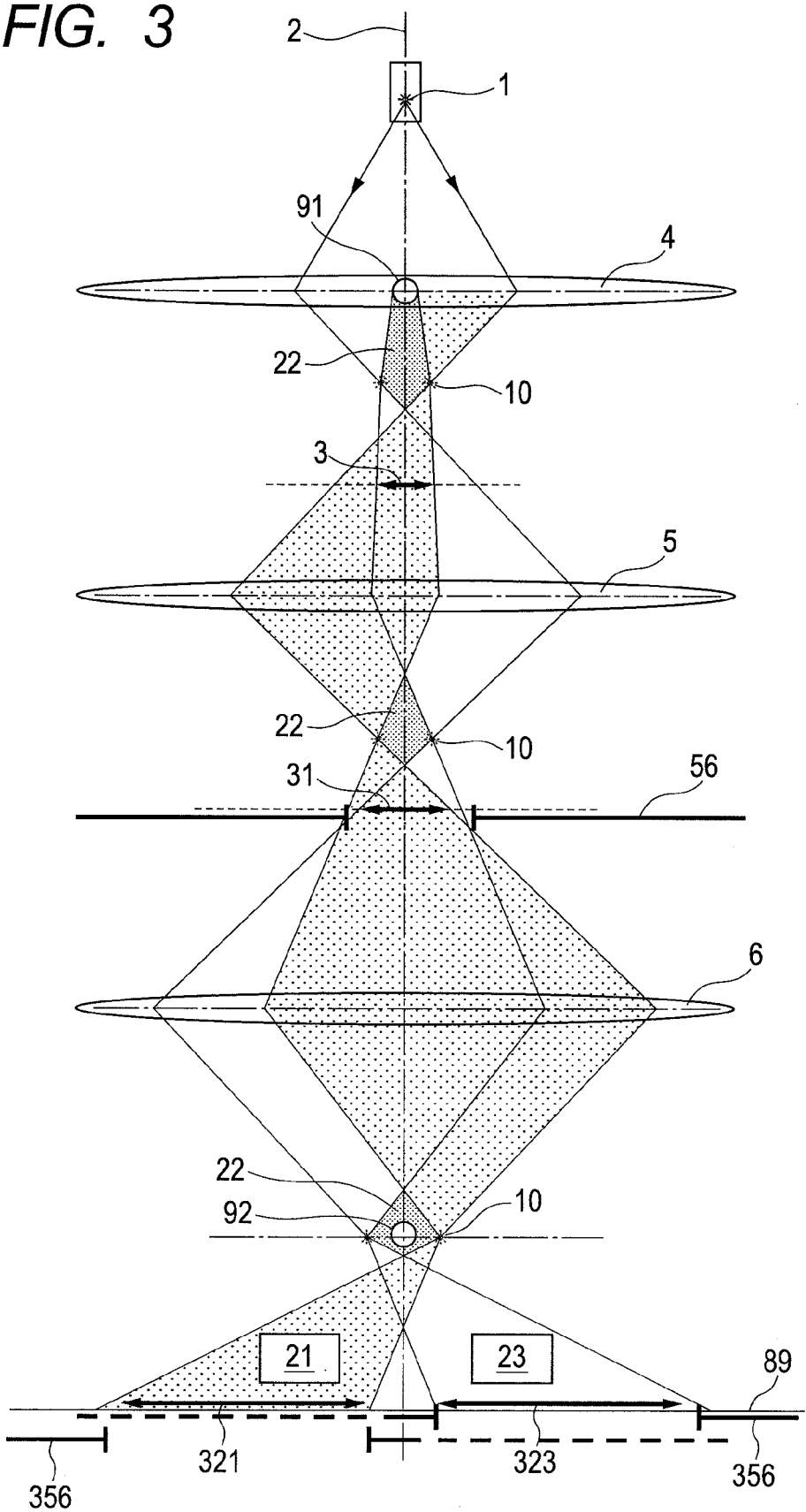
FIG. 3 is a schematic view showing another optical system to which the present invention is applied wherein the right visual field image and the left visual field image are focused in the state of being interchanged from the optical system shown in FIG. 2.

The optical system shown in FIG. 3 represents an example of reversing the polarity of the voltage $V_f$ applied to the second electron biprism 92 from the polarity in the optical system shown in FIG. 2. By largely deflecting the right visual field electron beam 21 and the left visual field electron beam 23, it is possible to record a right visual field image 321 and a left visual field image 323 in the detection systems reversed from the case shown in FIG. 2.

When a specimen is stereoscopically observed with the configuration of the optical system shown in FIG. 3, specimen images the asperities of which are reversed from those of the optical system shown in FIG. 2 are obtained. In this way, the way of using the second electron biprism 92 in the present invention: is essentially different from the way of using an electron biprism used in conventional electron holography or the like; and is characterized by being used for spatially separating two electron beams in order to focus two specimen images individually and obtain them by a detecting unit.

Further, when a wide range is irradiated by an incident electron beam, there is the possibility that two specimen images are not sufficiently separated only by deflection with the second electron biprism 92 and a right visual field image and a left visual field image are superimposed on each other like a right visual field image is superimposed on a left visual field image and vise versa. On this occasion, a measure against the possibility is to prevent the two specimen images from being superimposed by restricting the visual fields immediately prior to an observation record plane 89. On this occasion however, visual field restriction with two apertures is required. To this end, it is rational to restrict a visual field at the initial stage of image forming with a selected area aperture 56 as shown in FIG. 3. By so doing, the image 356 of the selected area aperture is superimposed on the specimen images (the right visual field image 321 and the left visual field image 323).

Figure 4:
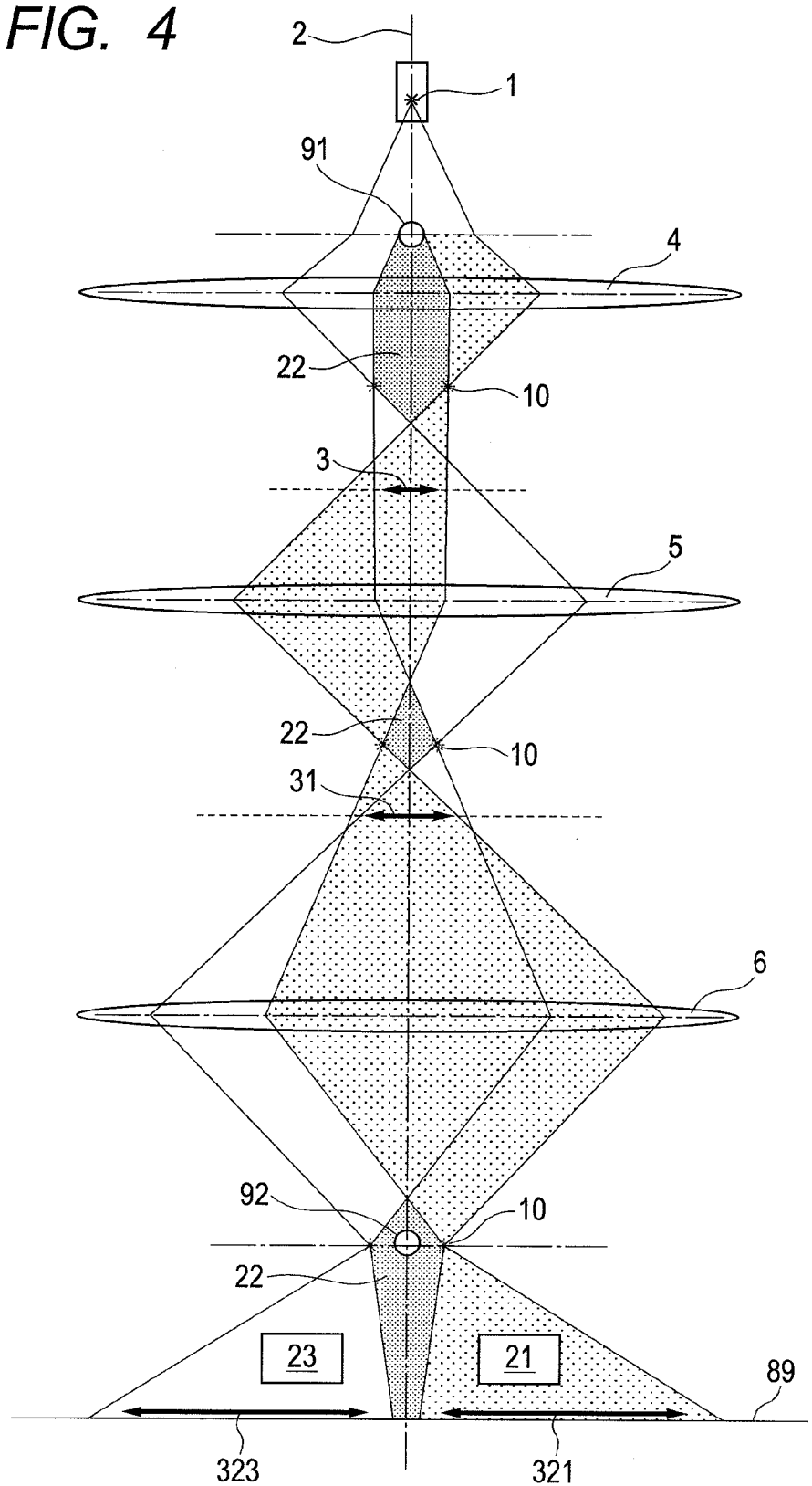
FIG. 4 is a schematic view showing another optical system to which the present invention is applied wherein an electron biprism in a condenser optical system is disposed above an irradiation lens.
Figure 5:
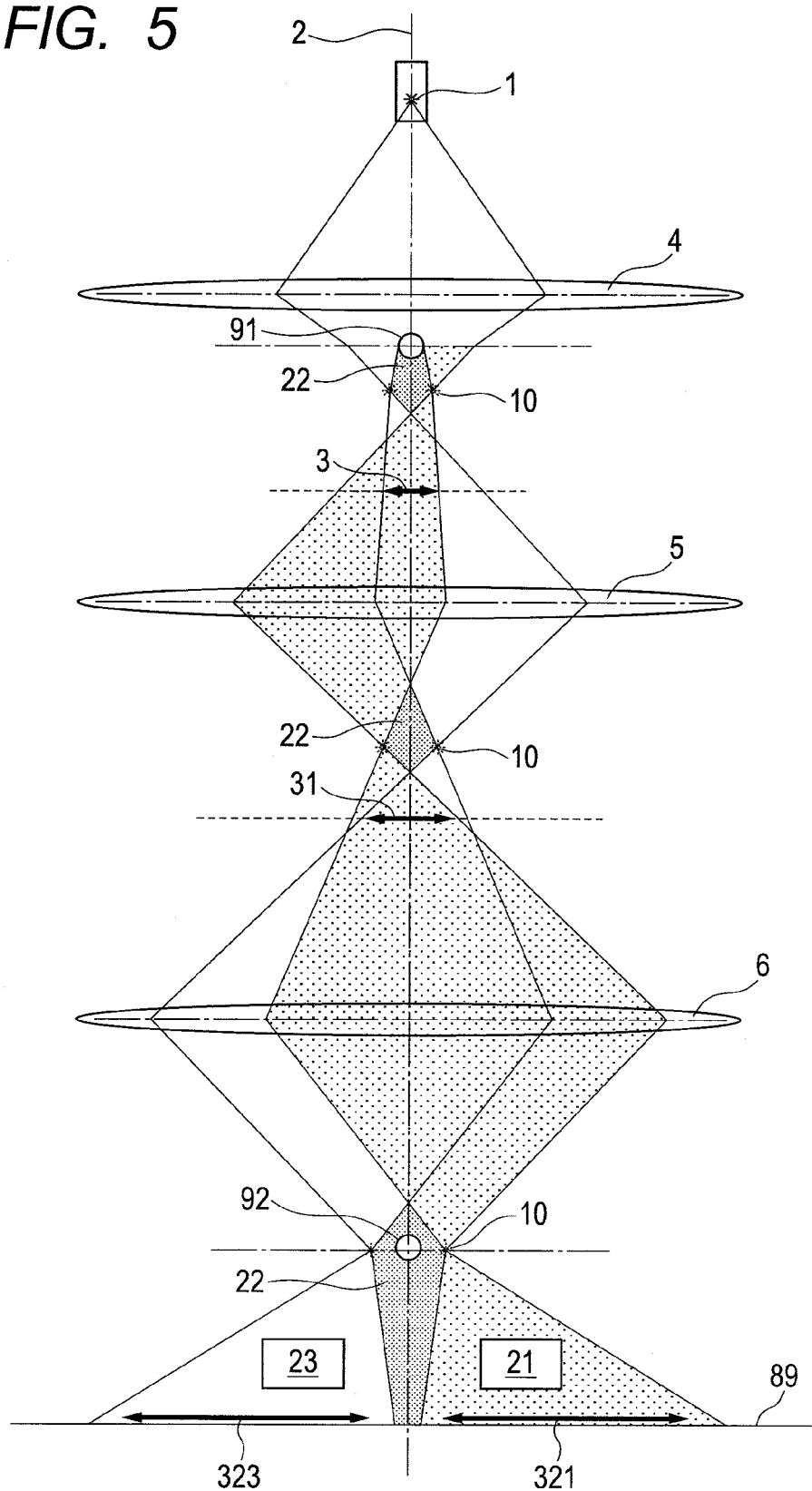
FIG. 5 is a schematic view showing another optical system to which the present invention is applied wherein an electron biprism in a condenser optical system is disposed below an irradiation lens.
Figure 6:
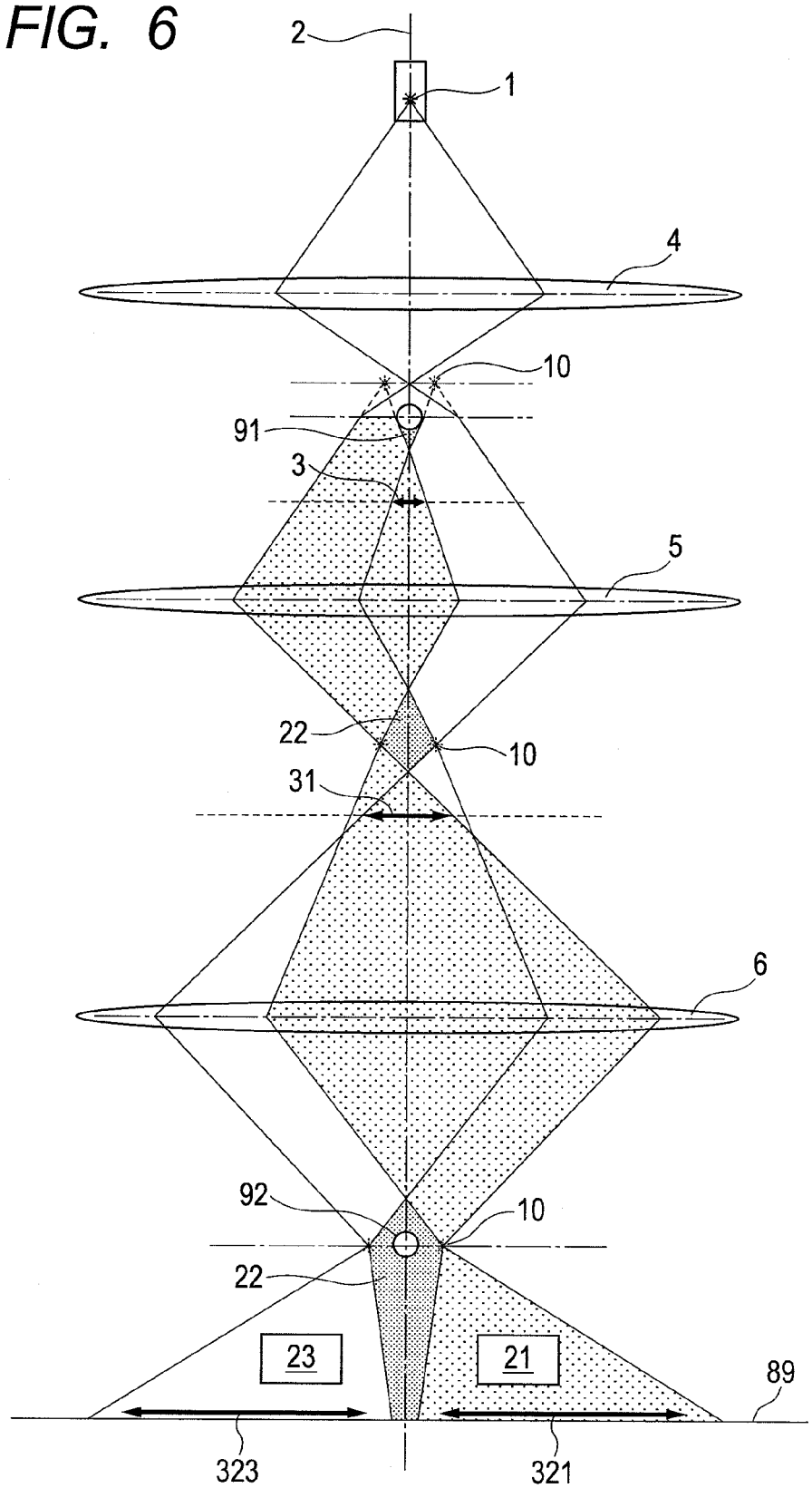
FIG. 6 is a schematic view showing an optical system in the case of applying the present invention and disposing an electron biprism in a condenser optical system below an irradiation lens and further below the image of a source.

As stated earlier, with regard to the location where the first electron biprism is disposed, any location is acceptable as long as the location is in the condenser optical system on the electron beam upstream side of the location where a specimen is placed on the optical axis of an electron beam. Examples of optical systems configured by changing the location of the first electron biprism 91 in the electron beam traveling direction are shown in FIGS. 4, 5, and 6 respectively. The optical system shown in FIG. 4 is an example of the first electron biprism 91 being disposed further on the upstream side of the irradiation lens 4 disposed immediately above the specimen 3 in the electron beam traveling direction. The optical system shown in FIG. 5 is an example of the first electron biprism 91 being disposed on the downstream side of the irradiation lens 4 disposed immediately above the specimen 3 and on the upstream side of the image 10 of a source focused with the irradiation lens 4 in the electron beam traveling direction. The optical system shown in FIG. 6 is an example of the first electron biprism 91 being disposed on the downstream side of the irradiation lens 4 disposed immediately above the specimen 3, further on the downstream side of the image 10 of a source focused with the irradiation lens 4, and on the upstream side of the location of the specimen 3. By changing the location of the first electron biprism 91 in the electron beam traveling direction as stated above, the irradiation angle to a specimen changes and further the information of the specimen image obtained on an observation record plane also changes.

The voltage $V_f$ applied to the first electron biprism 91 in each of the optical systems shown in FIGS. 2, 3, 4, and 5 is negative and the voltage $V_f$ applied to the first electron biprism 91 in the optical system shown in FIG. 6 is positive and they are different from each other. This is determined by the locations of the first electron biprism 91, the irradiation lens 4, and the image 10 of the source and they are comparable with regard to the function of irradiating a prescribed region on a specimen from two directions with the first electron beam 21 and the second electron beam 23 in an optical system.

Figure 7:
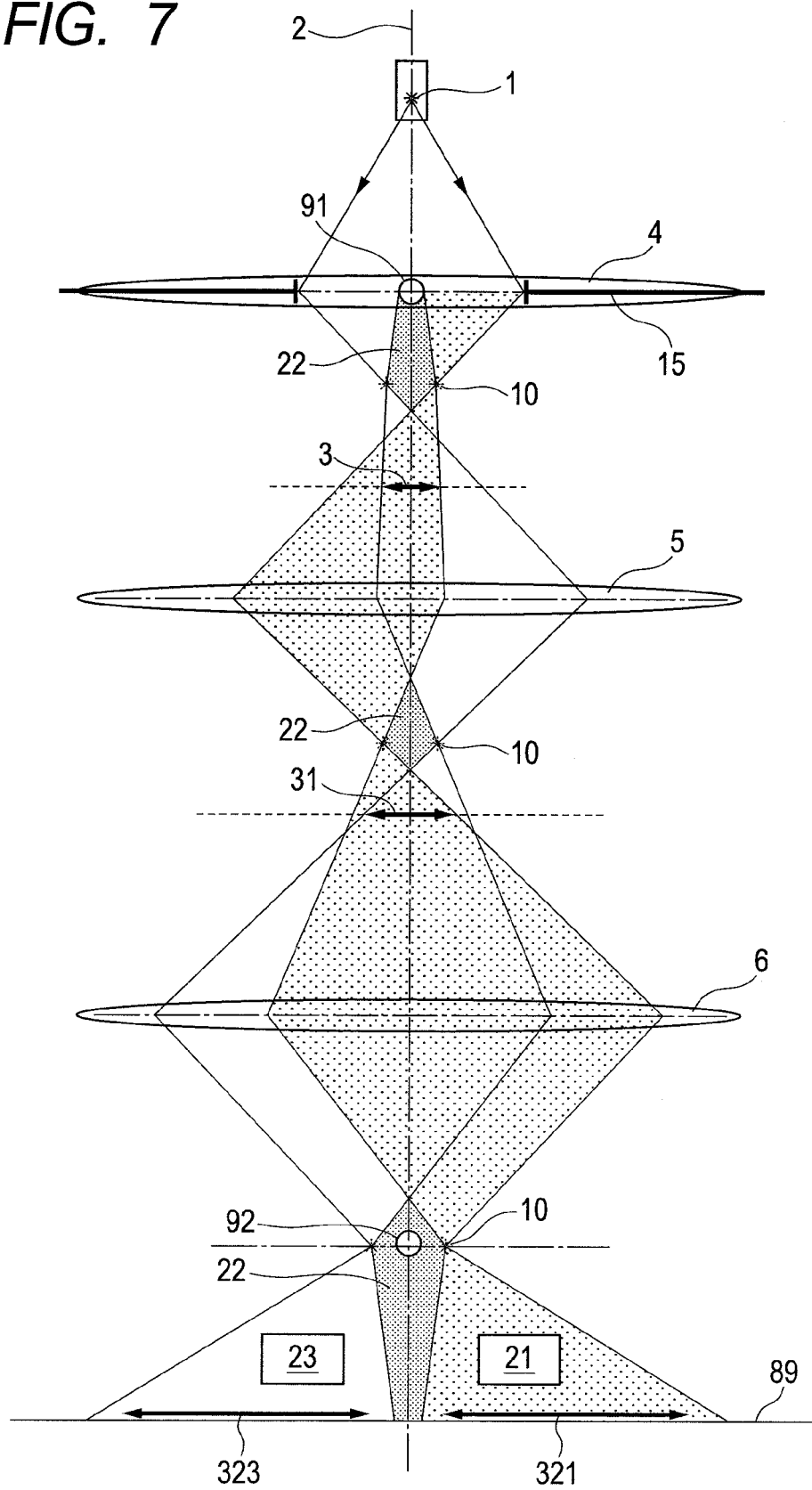
FIG. 7 is a schematic view showing an optical system in the case of applying the present invention and using an electron biprism in a condenser optical system together with a condenser aperture.

The first electron biprism 91 that separates and pluralizes the irradiation angle of an electron beam to a specimen 3 can be used together with a condenser aperture 15 used when the irradiation angle and an irradiation electron beam quantity are controlled. An example of the combination use of the condenser aperture 15 and the first electron biprism 91 is shown in FIG. 7. In the example, the center ultrafine filament electrode of the first electron biprism 91 is disposed in the center of the condenser aperture (one aperture) and they are disposed in the vicinity of the principal plane of the irradiation lens 4.

Figure 8:
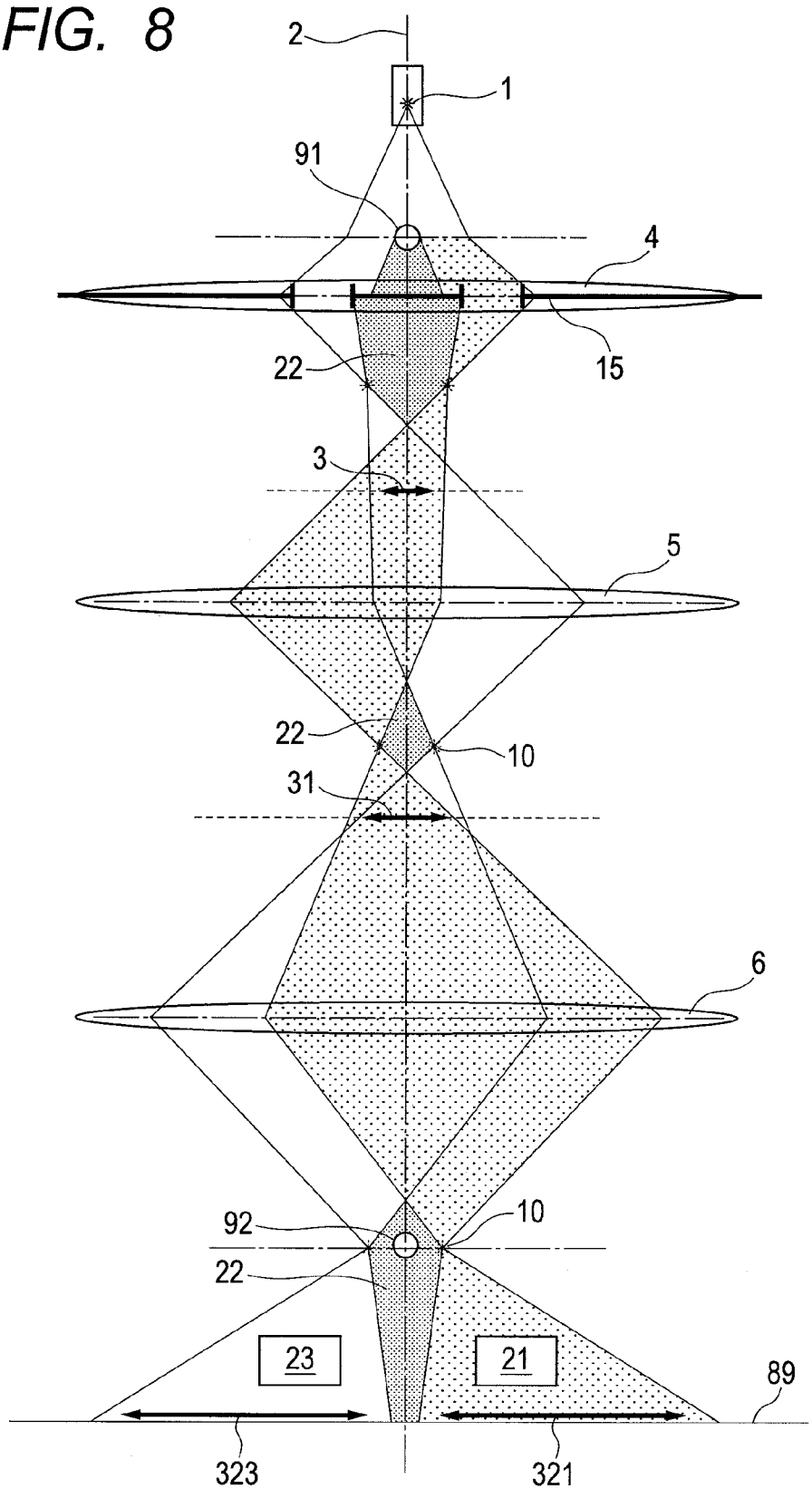
FIG. 8 is a schematic view showing an optical system in the case of applying the present invention and using an electron biprism in a condenser optical system above and together with a condenser aperture.

The optical system shown in FIG. 8 is an example of the case where a stop having two apertures is used as the condenser aperture 15 and the location of the condenser aperture 15 does not conform to the location of the first electron biprism 91. That is, the condenser aperture 15 is disposed in the vicinity of the principal plane of the irradiation lens 4 and the first electron biprism 91 is disposed on the upstream side of the condenser aperture 15.

As shown in the optical system of FIG. 8, when the condenser aperture is divided into two apertures, in some excitation (a focal length) of the irradiation lens 4, it is possible to produce two irradiation angles for a specimen even without the function of the first electron biprism 91 to deflect an electron beam but, in consideration of the controllability required of the condenser optical system, it is appropriate to prepare the first electron biprism.

<Application to Interference Optical System>

In the aforementioned optical system, the coherence of an electron beam has not particularly been taken into consideration. A Fresnel diffraction electron beam generated with a condenser aperture and the center ultrafine filament electrode of a first electron biprism is applied to a specimen together with main electron beams 21 and 23 in a superimposed manner and generates Fresnel fringes but, when a thermal electron source is used as a source, the coherence of an electron beam is low and the region where Fresnel fringes are generated is limited to the periphery of the specimen irradiation region and hence no problem arises. This is obvious from the fact that the Fresnel fringes generated with the condenser aperture do not influence an observation image in a thermal electron type electron microscope. In the case where the electron beam source is a field emission type for example however, the influence of the Fresnel fringes may extend widely in an irradiation region and may influence even an observation image in some cases.

Figure 9:
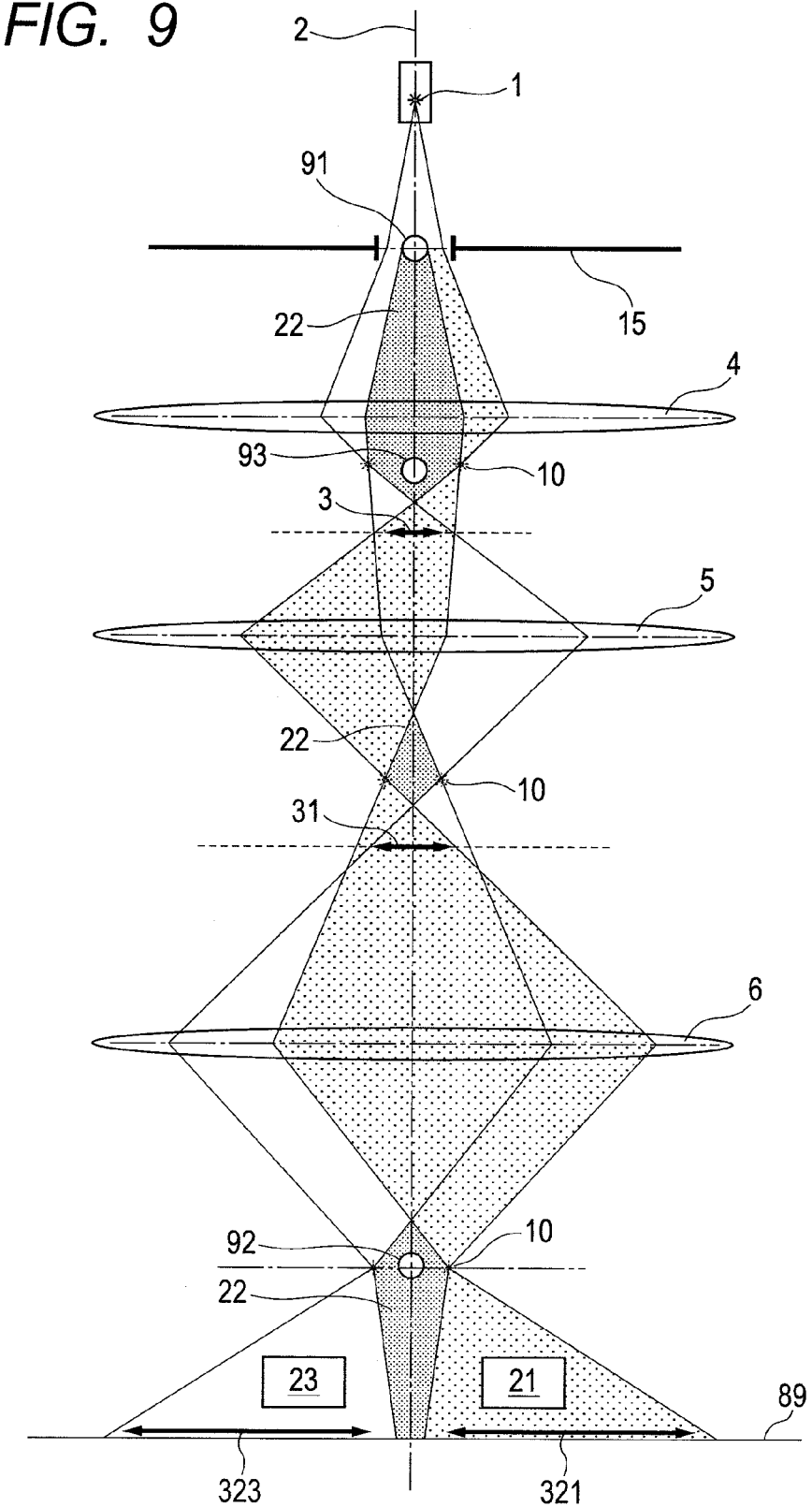
FIG. 9 is a schematic view showing an optical system in the case of applying the present invention and using two electron biprisms in a condenser optical system.

The optical system shown in FIG. 9 represents an optical system of an interference type electron microscope to which the present invention is applied. The optical system is characterized by using two electron biprisms in a condenser optical system. In this optical system, Fresnel fringes are inhibited from appearing by disposing a first electron biprism 91 and a condenser aperture 15 on the subject plane of an irradiation lens 4 and focusing the images of the first electron biprism 91 and the condenser aperture 15 on a specimen 3. Since an identical prescribed region of the specimen 3 is irradiated by two electron beams 21 and 23, in the condenser optical system, a third electron biprism 93 is disposed in a space 22 at the shadow of the first electron biprism 91 and deflects the two electron beams 21 and 23. By adopting the allocation, Fresnel diffraction caused by the third electron biprism 93 does not occur. When this condenser optical system is adopted therefore, even an interference type electron microscope does not undergo the influence of Fresnel fringes and it is possible to observe and record two specimen images in an identical visual field.

Figure 10:
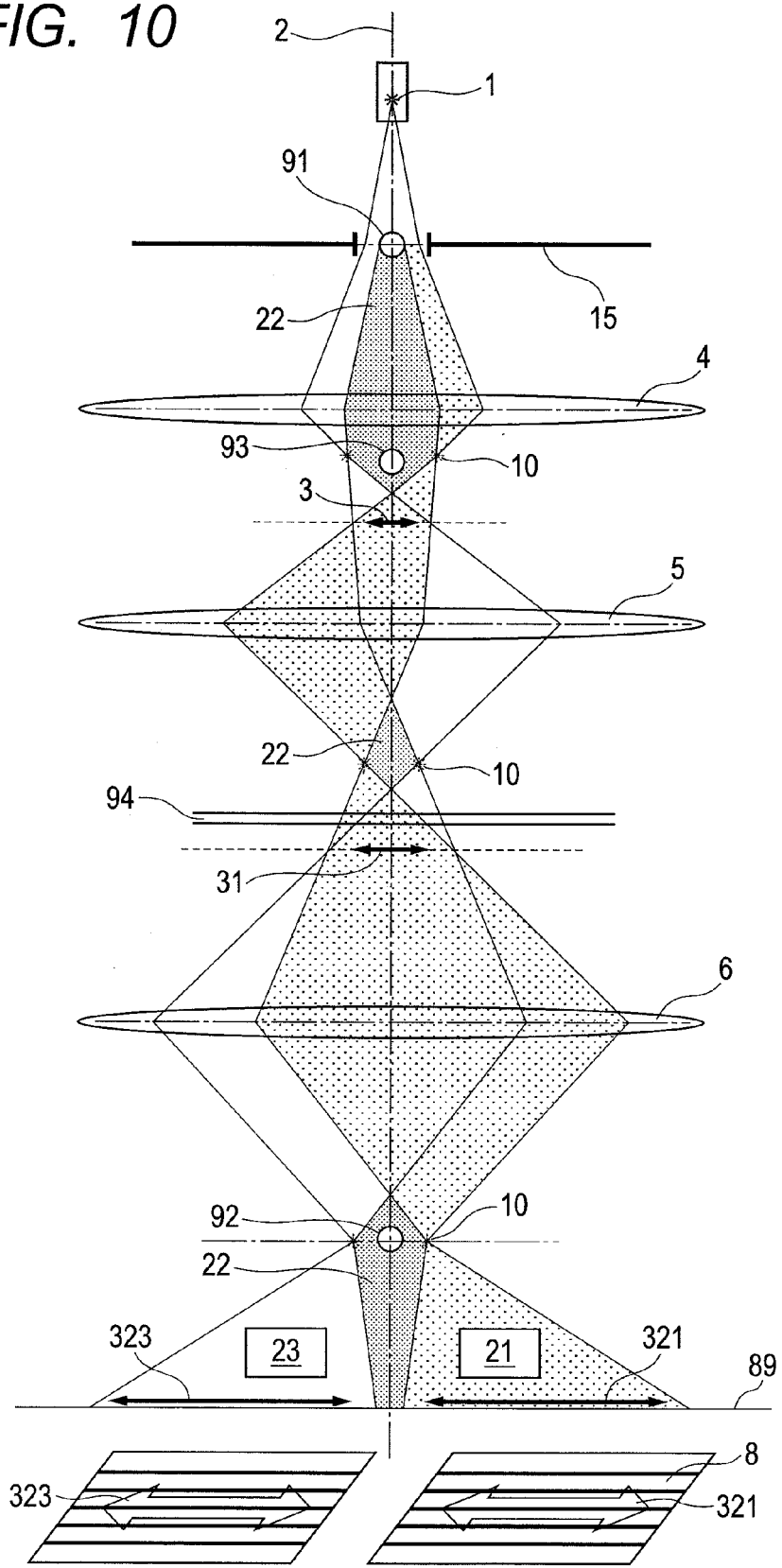
FIG. 10 is a schematic view of an optical system showing the principle for obtaining an interferogram in the present invention.

The optical system shown in FIG. 10 is an example of an optical system formed by further adding a fourth electron biprism 94 for applying electron holography in an interference type electron microscope shown in FIG. 9. That is, the fourth electron biprism 94 for obtaining an interferogram is disposed on the electron beam downstream side of an objective lens 5 and on the upstream side of the image 31 of the objective lens. The orientation of the center ultrafine filament electrode of the fourth electron biprism 94 is on the paper plane of FIG. 10 and perpendicular to an optical axis 2 and is in "a twisted positional relation" with the orientation of the first electron biprism 91. That is, object waves and reference waves of both the right visual field electron beam 21 and the left visual field electron beam 23 on electron optics are split vertically to the paper plane with the fourth electron biprism 94. The way of the object waves and the reference waves of the right visual field electron beam 21 and the left visual field electron beam 23 respectively drawing specimen images (321 and 323) and interference fringes 8 on an observation record plane 89 is drawn at the lower part in FIG. 10. The optical system for applying electron holography can be constructed completely identically to a conventional electron beam interference microscope and, as shown in FIG. 10, not only the case of using only one stage of an electron biprism for interference but also the case of a two-stage electron biprism interference optical system disclosed in JP-A-2005-197165 can be constructed in the same way as a conventional method. That is, an optical system for simultaneously obtaining two visual fields according to the present invention does not hinder the construction of an interference optical system and the observation of the interferogram thereby.

The optical system shown in FIG. 10 is identical to the optical system shown in FIG. 9 if it is used in the state of not applying voltage to the fourth electron biprism 94. Consequently, with the same device, by changing the state of applying voltage to the fourth electron biprism 94, it is possible to selectively carry out the treatment of observing and recording two specimen images in an identical visual field and the treatment of observing and recording the interferogram of two specimen images in an identical visual field as the situation demands.

Figure 11:
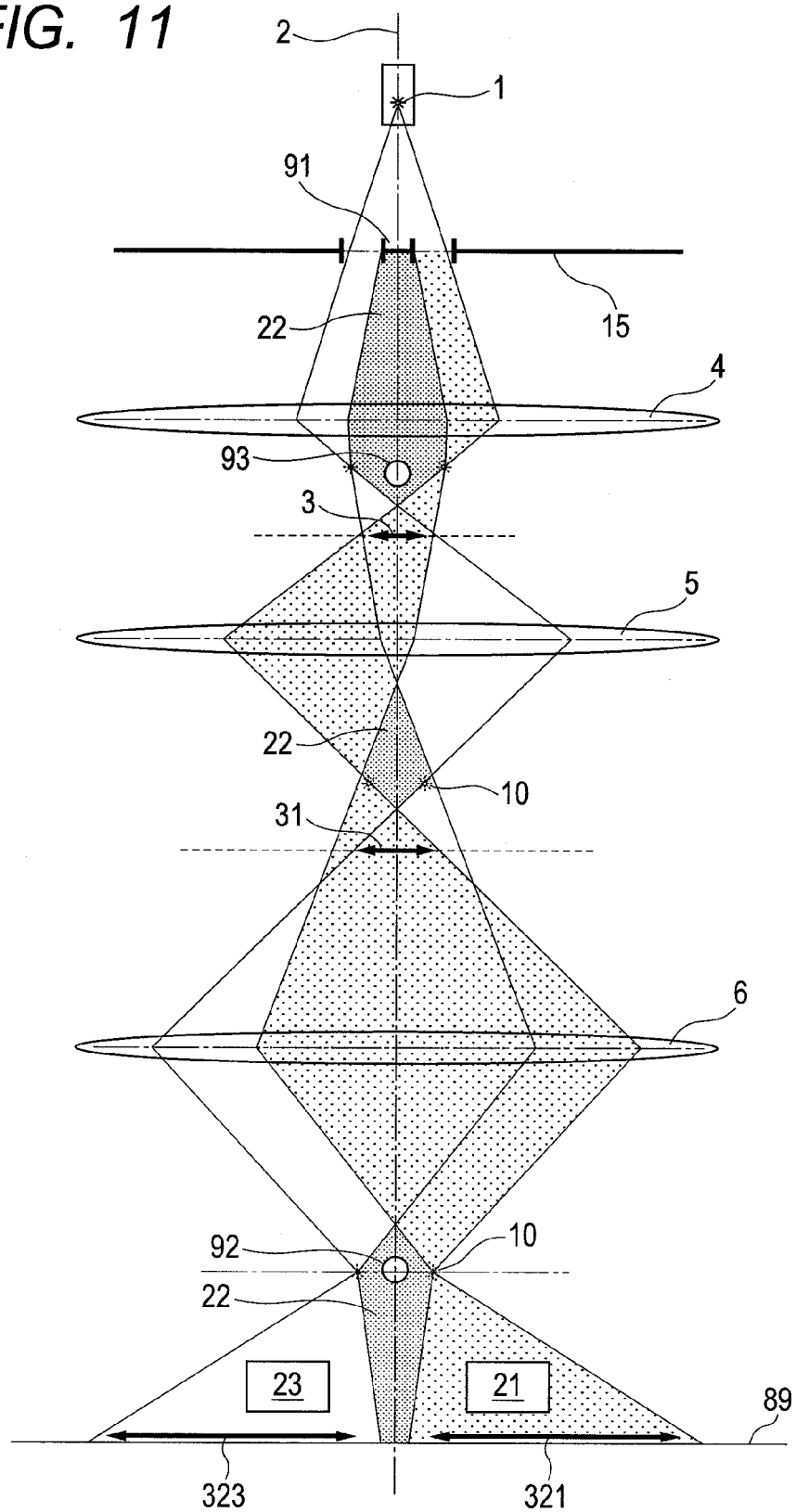
FIG. 11 is a schematic view showing an optical system in the case of applying the present invention and using an electron biprism in a condenser optical system below and together with a condenser aperture.

FIG. 11 is an example of a condenser optical system for an interference type electron microscope in the case of using a condenser aperture 15 having two apertures in the same way as the optical system shown in FIG. 8. Fresnel fringes are inhibited from appearing by setting the condenser aperture 15 on the subject plane of an irradiation lens 4 and setting the location of a specimen on the image plane. Then a third electron biprism 93 is disposed in a space at the shadow between the apertures of the condenser aperture in order to irradiate an identical visual field on the specimen with an electron beam having two angles. The concept of the optical system is the same as that of the optical system shown in FIG. 8 except that the location of the condenser aperture 15 in the electron optical system is set at the subject plane of the irradiation lens 4. Here, FIG. 11 shows that, in the case of adopting a condenser aperture 15 having two apertures, it is possible to produce two irradiation angles to a specimen by not using a first electron biprism 91 but using only the third electron biprism 93.

Each of the above-explained optical systems according to the present invention is characterized by: producing two electron beams having different irradiation angles by using one or two electron biprisms disposed in a condenser optical system; irradiating and transmitting a specimen; thereafter spatially separating each of the electron beams with an electron biprism in a magnifying imaging optical system again; and individually focusing and recording respective electrons as different specimen images.

Here, in such an interference type electron microscope, the stability of an irradiation electron beam is directly related to the coherence of the electron beam and it is a matter of course that, in installation in an electron microscope, attention and device must be paid so that charging effect in a first electron biprism, a lead-in wire for applying voltage, and the like may not be a source of noises caused by an induction field.

Examples of a transmission electron microscope to which the present invention is concretely applied are hereunder explained in detail with reference to drawings.

First Embodiment

Figure 12:
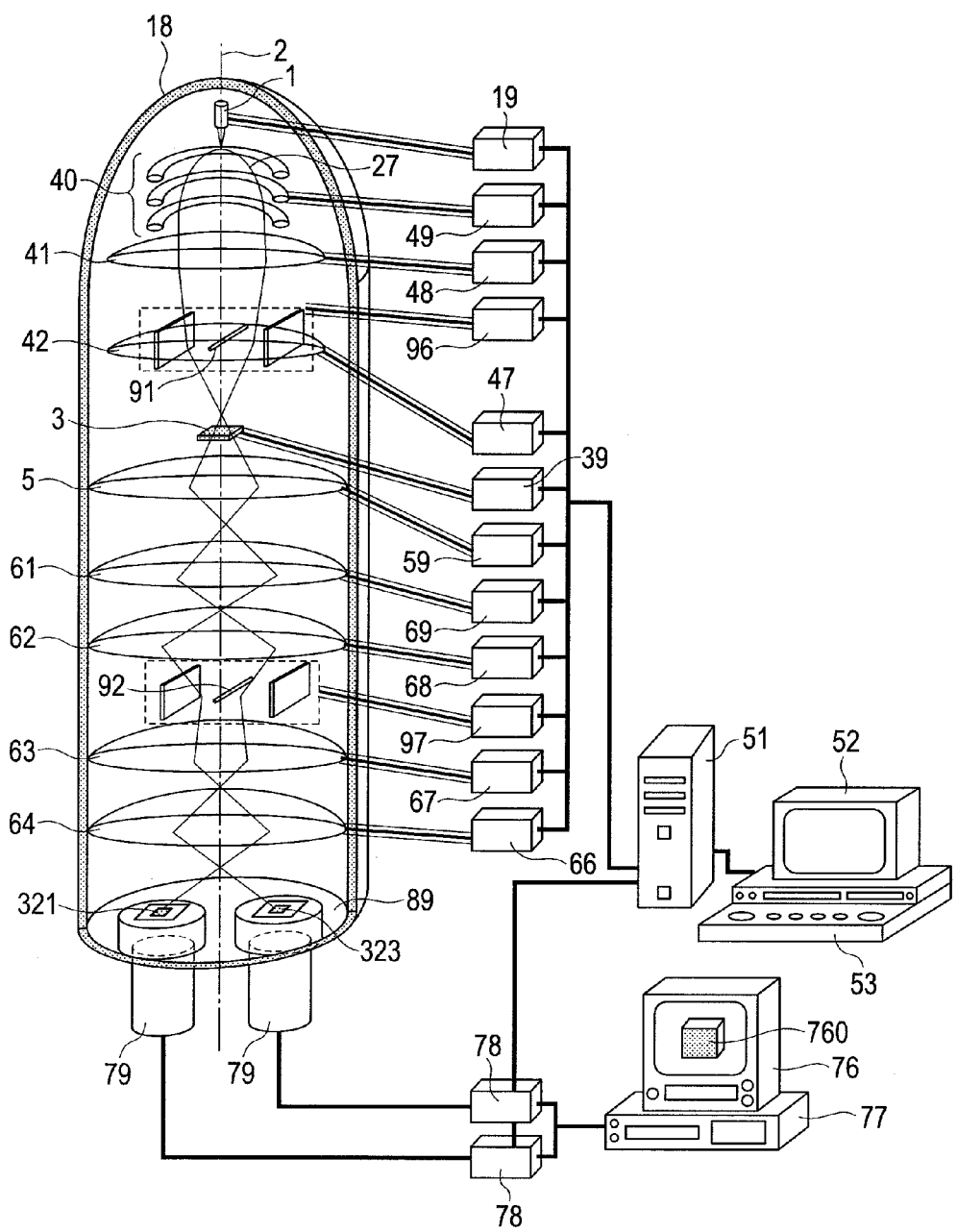
FIG. 12 is a schematic view showing a configuration example of an electron microscope according to a first embodiment of the present invention.

As a first embodiment according to the present invention, an example of a transmission electron microscope on which an optical system shown in FIG. 4 is mounted is shown in FIG. 12. In FIG. 12, an electron-optical system has: an electron source (or an electron gun) 1; an acceleration tube 40; a condenser optical system (a first condenser lens 41 and a second condenser lens 42); and an imaging optical system (an objective lens 5, a first imaging lens 61, a second imaging lens 62, a third imaging lens 63, and a fourth imaging lens 64). The electron-optical system is assembled in a vacuum chamber 18 and the vacuum chamber is continuously exhausted with a vacuum pump.

Further, the reference numeral 19 represents a control unit of the electron source, 49 a control unit of the acceleration tube, 48 a control unit of the first condenser lens, 96 a control unit of a first electron biprism, 47 a control unit of the second condenser lens, and 39 a control unit of a specimen 3 for controlling the specimen through a specimen holder (not shown in the figure). The reference numeral 59 represents a control unit of the objective lens, 69 a control unit of the first imaging lens, 68 a control unit of the second imaging lens, 97 a control unit of a second electron biprism, 67 a control unit of the third imaging lens, 66 a control unit of the fourth imaging lens, and 51 a control system computer. The control unit 96 of the first electron biprism and the control unit 97 of the second electron biprism control voltage $V_f$ applied to center ultrafine filament electrodes 9 of the first and second electron biprisms respectively based on the relation of the expression $\alpha = kV_f$.

The control system computer 51: has an arithmetic processing section and a memory section or a data storage for storing prescribed information; and is connected to a monitor 52, a user interface 53 functioning as a man-machine interface between the electron microscope main body and an operator, and an image recording/arithmetic processing apparatus 77. The reference numeral 79 represents imaging units functioning as detecting unit for detecting the images of two electron beams (a right visual field electron beam 21 and a left visual field electron beam 23) obtained on an observation record plane of the specimen and the reference numeral 78 represents control units of the imaging units 79.

Figure 13:
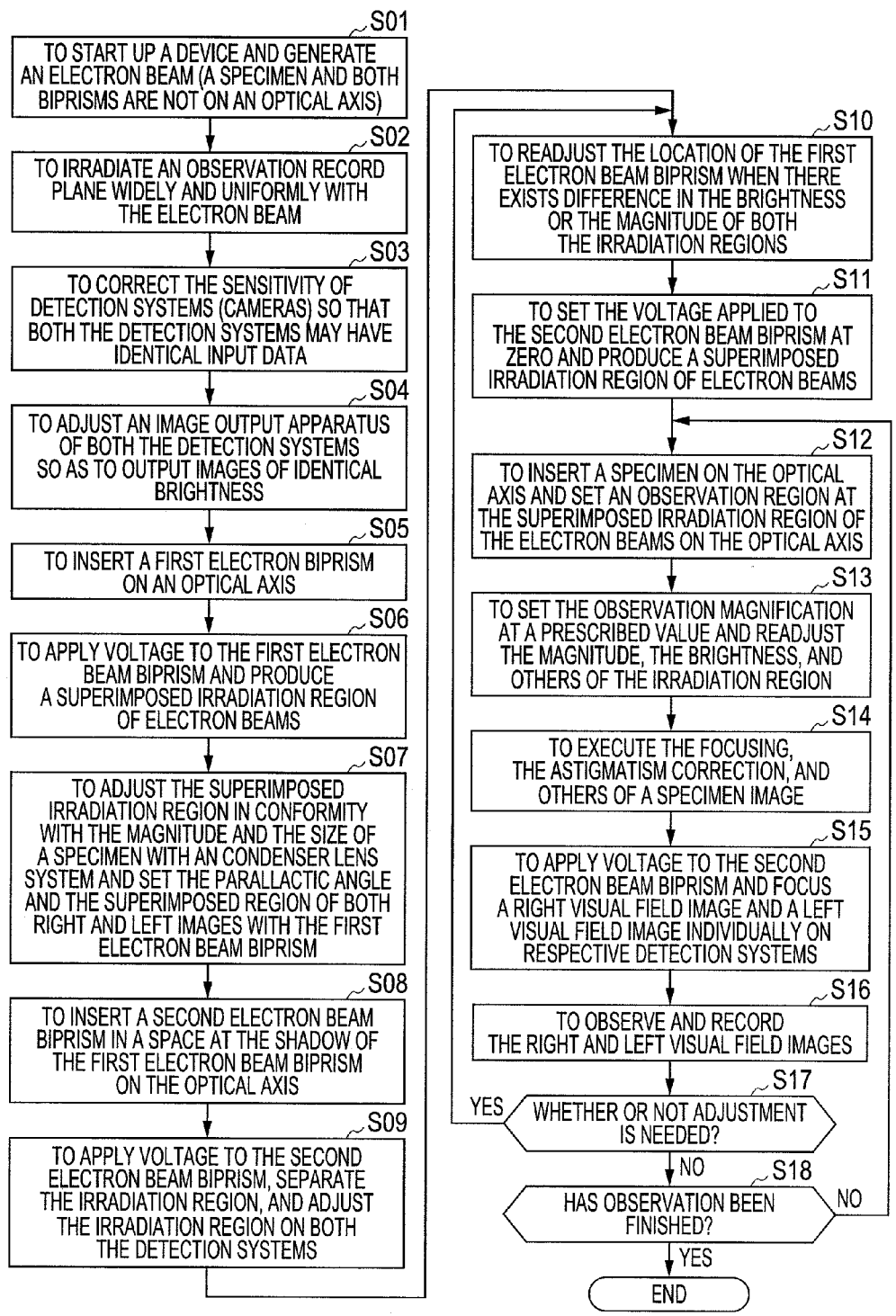
FIG. 13 is a flowchart showing an adjustment method of an optical system according to the first embodiment.

Programs for recording and observing a specimen by controlling the aforementioned control units, including a program for executing a flowchart that will be explained in FIG. 13, are stored in the memory section of the control system computer 51 and the control system computer 51 controls the aforementioned control units in accordance with those programs. The user interface 53 has an information input unit such as a keyboard, a mouth, and a GUI function. The image recording/arithmetic processing apparatus 77 (hereunder referred to also as an image processing apparatus or an arithmetic processing apparatus) has the functions of recording information on plural specimen images obtained with the imaging units 79, producing a image having new information by processing the recorded image information, and displaying the image on an image display device 76.

Here, each of the imaging units 79 constituting the detecting unit may be, for example, either a unit having the function of detecting and the function of recording a specimen image or a unit having only the function of detecting a specimen image on the observation record plane like an optical sensor and sequentially transmitting the result to the image recording/arithmetic processing apparatus 77. For example, in the case of a TV camera or a CCD camera, a specimen image is detected, subjected to A/D conversion, temporally recorded in a recording medium, and transmitted to the image recording/arithmetic processing apparatus 77 or the like. In the case of an optical sensor, a photoelectric conversion element such as a photodiode and an A/D converter for converting an analog signal transmitted from the photoelectric conversion element into a digital signal are prepared, the light of a specimen image is detected, and digital data produced by subjecting the information to photoelectric conversion and A/D conversion are transmitted to the image recording/arithmetic processing apparatus 77 and the control system computer 51.

Here, in place of the image recording/arithmetic processing apparatus 77, it is also possible to: incorporate an image arithmetic program having the function of the image recording/arithmetic processing apparatus 77 into a high level computer connected through the control computer 51 and a network; construct two images including different pieces of information by using a right visual field image and a left visual field image or a three-dimensional shape by using the parallax or the like of a right visual field image and a left visual field image; display them on the monitor 52; and further output them to an output unit such as a printer.

Further, it is also possible to record information on plural specimen images obtained with the imaging units 79 and the result of the image processing thereof together with information including the measurement conditions and the measurement time of a specimen given by the control units into the data storages of the control computer 51 and a high level computer so as to be used by another operator or another person.

In the present embodiment, the first electron biprism 91 on the upstream side of the specimen 3 in the electron beam traveling direction is disposed in the vicinity of the principal plane of the second condenser lens 42 in the condenser optical system. Then the specimen 3 is irradiated from two directions of different angles and the transmitted two electron beams (21 and 23): are magnified with the objective lens 5 and the first and second imaging lenses 61 and 62 in the imaging optical system; thereafter are spatially separated with the second electron biprism 92 disposed on the downstream side in the electron beam traveling direction; further pass through the two-stage imaging lenses 63 and 64; and then are focused into two images 321 and 323 on the observation record plane 89. FIG. 12 shows the state where the two images 321 and 323 are: detected and recorded with the imaging units 79 the sensitivity of which is adjusted respectively; sent to the arithmetic processing apparatus 77; and output onto the display device 76 as one image data 760. The processing data of the arithmetic processing apparatus 77 are stored also in the data storage of the control system computer 51 and used for the observation, analysis, and others of the specimen surface.

Two electron biprisms and the lenses of the magnifying imaging system are drawn in FIG. 12 on the assumption that a conventional electron microscope of 100 to 300 kV is used but the constituent elements in such an electron microscopic optical system are not limited to the figure. Further, in an actual device, besides the constituent elements shown in FIG. 12, there exist a beam deflection system to change the traveling direction of an electron beam, an aperture mechanism to restrict the permeation region of an electron beam, and others. Those units are omitted in the figure however since they have no direct relation with the present invention. Further, an evacuation system is also omitted since it has no direct relation with the present invention. The same is applied to the following figures.

Here, an example of a method for adjusting two imaging units 79 in a detection system is described.

(1) Adjustment of Sensitivity

Even when the same kind and the same type of record media are used, the brightness and contrast of two specimen images have to be identical in order to sterically observe the specimen images in right and left visual field in a natural way. To this end, an observation record plane 89 is irradiated widely and uniformly with an electron beam in the state of not inserting first and second electron biprisms 91 and 92 on an optical axis and, on this occasion, sensitivity is adjusted so that the input data may take the same brightness at the imaging units 79 functioning as the two detection record media in the detection system. A display device 76 such as a monitor to which the input data are output is also adjusted at the same time.

(2) Adjustment of Irradiation Electron Beam

After the above adjustment (1), the first and second electron biprisms 91 and 92 are inserted on the optical axis 2, an electron beam is deflected appropriately, and two specimen images of right and left visual fields are obtained. On this occasion, the location of the first electron biprism 91 is adjusted so that difference in brightness may not appear between the right and left input images. Or otherwise, the irradiation position of the electron beam is adjusted.

In this way, an electron biprism that can be inserted and extracted easily on the optical axis 2 is conveniently used from the viewpoint of operability. Further, the locations of the electron biprisms must be fine-tuned. Any degree of accuracy however is enough as long as the accuracy is at the level of the performance of a currently used electron biprism.

It comes to be advantageous in actual use to make it possible to: adjust the imaging units 79 at any time; and correct the difference in brightness between right and left visual field images caused by some sorts of circumstances not in an electron-optical system but on the side of an image processing apparatus. It is a matter of course to: reserve an initial adjustment value on that occasion (the same sensitivity value) as default; and make it ready for return at any time.

Here, a method for adjusting the optical system including the sensitivity adjustment of the detection system is explained in reference to the flowchart shown in FIG. 13.

Step 01: Ordinary start-up operation is carried out and an electron beam is generated (at this point, a specimen and both electron biprisms are not on an optical axis).

Step 02: An observation record plane 89 is widely and uniformly irradiated by the electron beam.

Step 03: The sensitivity of cameras 79 in both detection systems 78 is corrected so that the detection systems may have identical input data.

Step 04: An image output apparatus 76 of both the detection systems is adjusted so as to output images of identical brightness.

Step 05: A first electron biprism 91 is inserted on an optical axis.

Step 06: Voltage is applied to the first electron biprism and a superimposed irradiation region of electron beams is produced. The superimposed irradiation region can be visually observed with a camera or through a viewport which can take the whole observation record plane in a visual field although it is not shown in FIG. 12.

Step 07: The superimposed irradiation region is adjusted in conformity with the magnitude and the size of a specimen to be observed with a condenser lens system and the parallactic angle and the superimposed region of both right and left specimen images are set with the first electron biprism.

Step 08: A second electron biprism 92 is inserted on the optical axis. The position is adjusted in a space 22 (a space where the second electron biprism 92 is not observed) at the shadow of the first electron biprism 91.

Step 09: Voltage is applied to the second electron biprism 92, and the irradiation region is separated and adjusted on both the detection systems 79. On this occasion, if both the irradiation regions are not sufficiently separated, either the irradiation system may be readjusted and the irradiation regions may be reduced or the visual fields may be restricted with a selected area aperture 56.

Step 10: When there exists difference in the brightness or the magnitude of both the irradiation regions, the location of the first electron biprism 91 is readjusted so as to minimize the difference.

Step 11: The voltage applied to the second electron biprism is set at zero and a superimposed irradiation region of electron beams is produced. That is, at this step, the optical system is adjusted so as to form one superimposed irradiation region in the vicinity of the center of the observation record plane 89.

Step 12: A specimen is inserted on the optical axis and an observation region is set at the superimposed irradiation region of the electron beams on the optical axis. That is, the optical system is adjusted so as to obtain a specimen image in the vicinity of the center of the observation record plane 89.

Step 13: The observation magnification is set at a prescribed value and the magnitude, the brightness, and others of the irradiation region are readjusted with the condenser optical system, if necessary.

Step 14: The focusing, the astigmatism correction, and others of the specimen image are executed.

Step 15: Voltage is applied again to the second electron biprism 92 and a right visual field image 321 and a left visual field image 323 are focused individually on respective detection systems. That is, the right visual field image 321 and the left visual field image 323 are focused on the observation record plane at the positions corresponding to two imaging units 79 located apart from each other.

Step 16: Observation and recording are executed. That is, the right visual field image 321 and the left visual field image 323 focused on the observation record plane are detected and recorded with the imaging units 79 such as TV cameras or CCD cameras and sent to an arithmetic processing apparatus 77, and the result of the image processing is observed on the monitor screen of the image display device 76. In the event of the observation, an intended image is displayed on the image display device 76 in accordance with the selection by an operator.

Step 17: When it is judged that the image is inappropriate and readjustment is required as a result of the observation, the procedure goes back to Step 10 and readjustment is carried out for example. On this occasion, since the specimen is already inserted on the optical axis, the specimen is extracted if the existence of the specimen is inappropriate. If adjustment operation can be done while the specimen is inserted, the specimen insertion operation at Step 12 is omitted. The step to return and the necessity of readjustment may be judged arbitrarily by an operator in accordance with the situation.

Step 18: When the observation of the specimen is continued by changing the observation conditions, the procedure goes back to Step 12 for example. The change of the observation conditions includes the change of the specimen observation region, the change of the magnification, the change of the specimen temperature, and other changes. The step to return and the necessity of continuous observation may be judged arbitrarily by an operator in accordance with the situation.

Through the above steps, it comes to be possible to simultaneously observe and record the right visual field image 321 and the left visual field image 323. Here, the processing in the observation and record of the specimen image and the processing in the arithmetic calculation and output of the recorded specimen image are carried out independently. That is, how the image data obtained at Step 16 are processed is decided arbitrarily by an operator. As shown also in the examples below, there are various possible applications including not only stereoscopic image observation but also simultaneous observation of two images having different kinds of information.

As explained above, in the present embodiment, after an electron beam is divided into two electron beams in a condenser optical system and each of the electron beams is adjusted so that a prescribed region of a specimen may be irradiated, transmitted, and expansively focused, the optical system requires no further operation. Consequently, the temporal change in the observation region of the specimen can be recorded as it is in real time. As a result, the dynamic and real-time stereoscopic image observation that has been impossible in principle by a conventional stereoscopic observation method comes to be possible.

Second Embodiment

Figure 14:
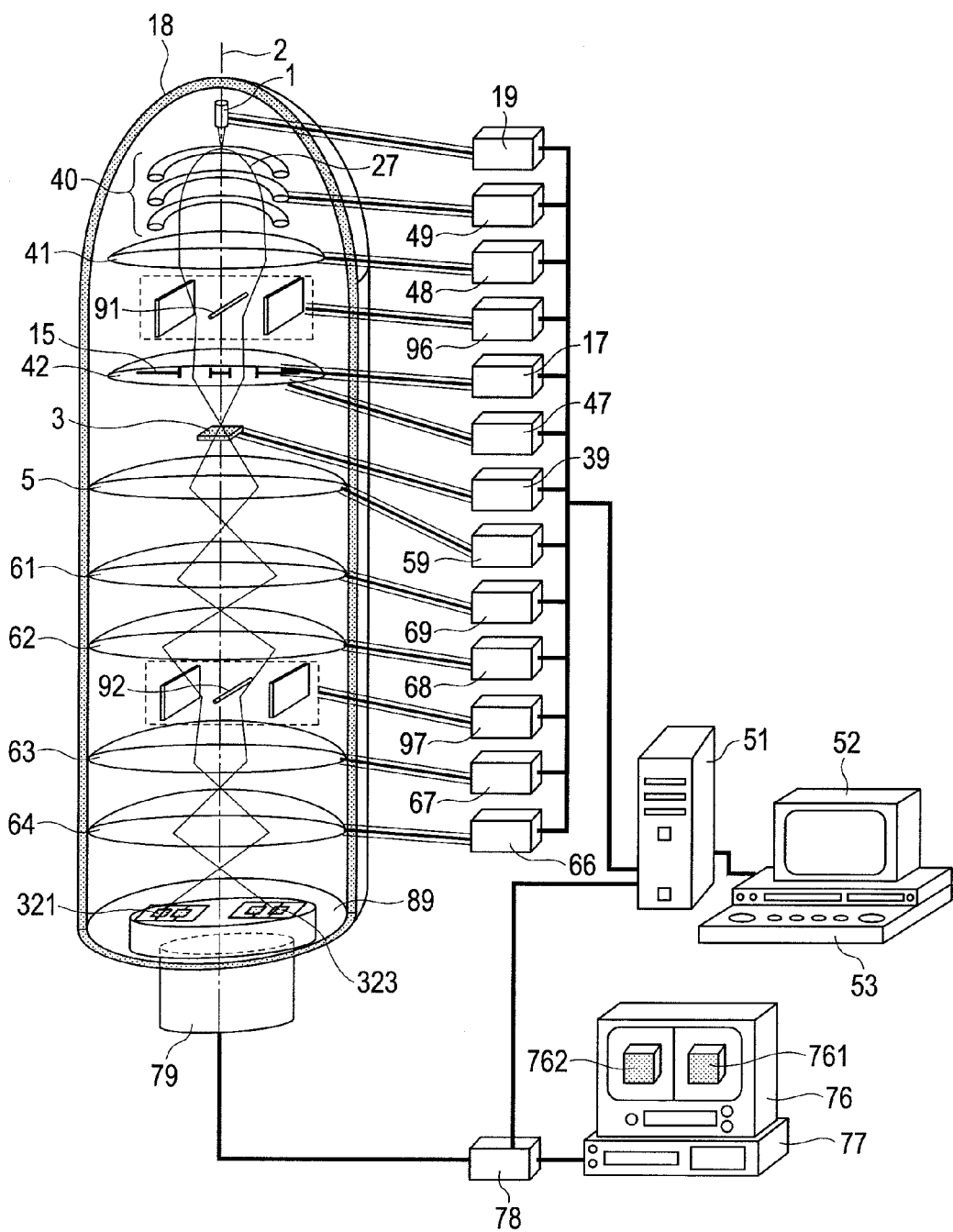
FIG. 14 is a schematic view showing a configuration example of an electron microscope according to a second embodiment of the present invention.

FIG. 14 shows an example of a transmission electron microscope on which an optical system shown in FIG. 8 is mounted. A condenser aperture 15 is disposed in the vicinity of the principal plane of a second irradiation lens 42 and a first electron biprism 91 is disposed on the upstream side of the condenser aperture 15. The reference numeral 17 represents a control unit to control the condenser aperture 15. The other part of the configuration is the same as the configuration shown in FIG. 12, but only one imaging unit 79 is installed. That is, one imaging unit 79 having a record area large enough to record two independent specimen images 321 and 323 is envisaged. In the case of the system, since only one reorder is used, unlike the case of the first embodiment, the sensitivity adjustment between imaging units (Steps 3 and 4 in FIG. 13) is not required. An output unit 76 is an example of a type of individually drawing two images 761 and 762.

In the present embodiment, in the same way as the first embodiment, temporal change in the observation plane of a specimen can be recorded as it is in real time. As a result, dynamic and real-time stereoscopic image observation that has been impossible in principle by a conventional stereoscopic observation method comes to be possible.

Third Embodiment

Figure 15:
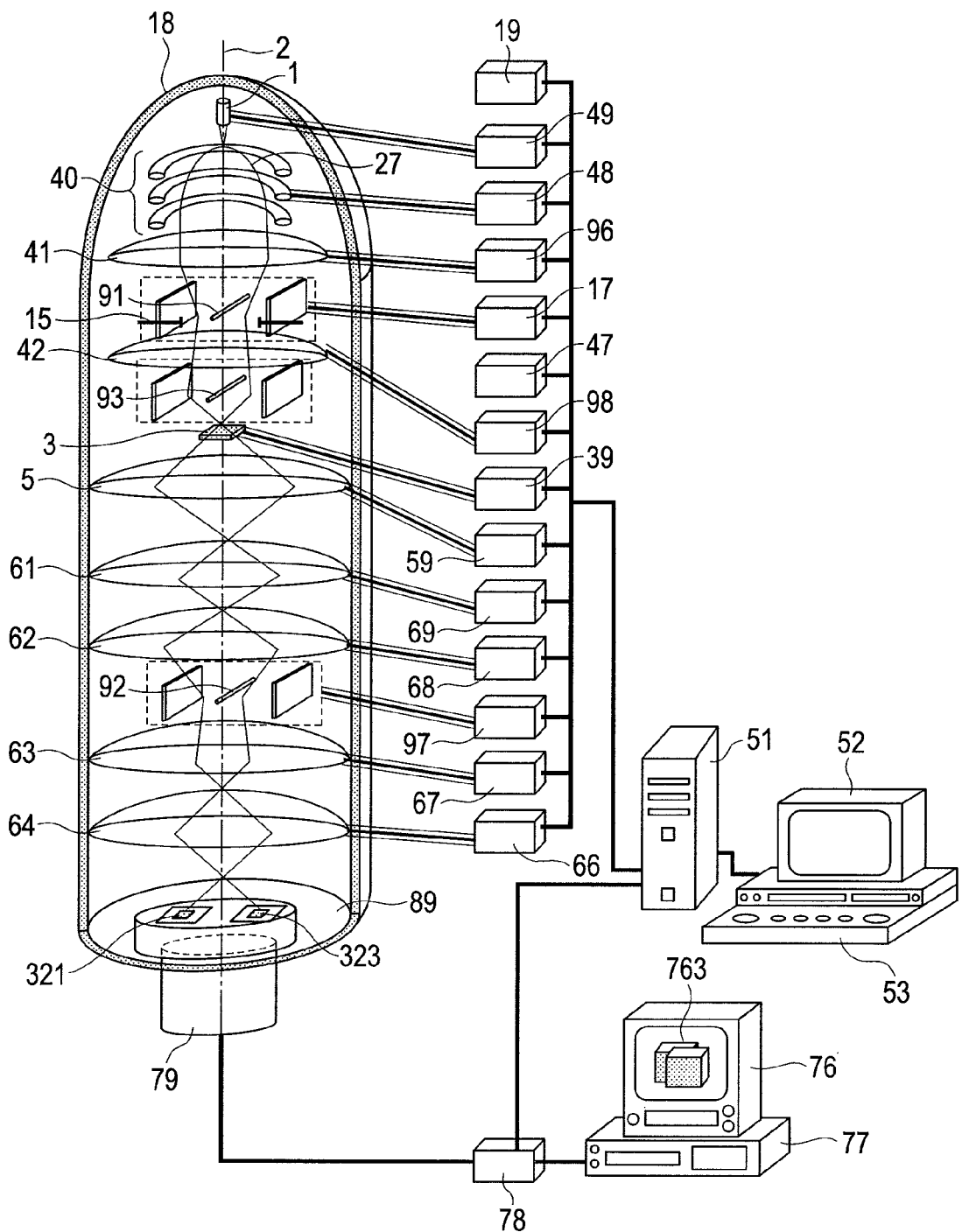
FIG. 15 is a schematic view showing a configuration example of an electron microscope according to a third embodiment of the present invention.

FIG. 15 shows an example of envisaging an interference type electron microscope that uses two electron biprisms in a condenser optical system shown in FIG. 9. In the condenser optical system, a third electron biprism 93 is disposed in a space 22 at the shadow of a first electron biprism 91, two electron beams 21 and 23 are deflected, and the same prescribed region of a specimen 3 is irradiated. The reference numeral 98 represents a control unit of the third electron biprism. With regard to an adjusting method of the optical system, in the flow shown in FIG. 13, processing on the third electron biprism 93 is added in addition to the processing on the first electron biprism 91 at steps 5 to 10.

By the configuration, Fresnel diffraction waves caused by the third electron biprism 93 do not appear. Other details are the same as Examples 1 and 2 described earlier. As an image output apparatus 76, for example, a stereoscopic monitor using a stereo viewer of a deflection type is envisaged and an image 763 formed by superimposing the right and left visual field images is drawn in FIG. 15.

In the present embodiment, in the same way as the first embodiment, temporal change in the observation plane of a specimen can be recorded as it is in real time and a stereoscopic image can be displayed. As a result, dynamic and real-time stereoscopic image observation that has been impossible in principle by a conventional stereoscopic observation method comes to be possible.

In the above first to third embodiments, the main purpose has been to obtain a three-dimensional image of a specimen by using respective images produced with two separated electron beams. After an electron beam is divided into two electron beams in a condenser optical system and each of the electron beams is adjusted so that a prescribed region of a specimen may be irradiated, transmitted, and expansively focused, the optical system requires no further operation. Consequently, temporal change of the specimen can be recorded as it is in real time. As a result, by the present invention, dynamic and real-time stereoscopic image observation that has been impossible in principle by a conventional stereoscopic observation method comes to be possible.

Further, as it is obvious from the first to third embodiments, an image observation record section and an image arithmetic calculation and output section in an electron microscope are independent and the combination thereof is free. As a result, apart from the concept of stereoscopic view with two images obtained simultaneously, other advantages and examples such as the double of data quantity caused by simultaneous obtainment of two kinds of specimen images, the improvement of temporal image accuracy, and the improvement of data accuracy and reliability caused by the complete identity of the magnifying imaging conditions to the two specimen images are named.

Here, it goes without saying that, with regard to the optical systems shown in FIGS. 3, 5 to 7, 10, and 11 too, in the same way as the first to third embodiments, each of the optical systems may be mounted on a transmission electron microscope and similar effects can be obtained. For example, with regard to the adjustment method of an optical system shown in FIG. 10, in the flow of FIG. 13, in addition to the processing on the adjustment of the first electron biprism 91 and the second electron biprism 92 at Steps 5 to 11, the processing on the adjustment of the third electron biprism 93 and the fourth electron biprism 94 is added.

Fourth Embodiment

<Application 1 to Tomography>

In tomography by an electron beam, a specimen is inclined around an axis perpendicular to an optical axis, specimen images at various angles are taken in a processing device, three-dimensional information of a prescribed region existing in an observation region is reconstructed. On this occasion, an angle region that does not allow the specimen to be observed is formed in the rotation angle of the specimen as long as it is not an acicular specimen extending in the direction of the rotation axis of the specimen. In order to compensate that, a method of rotating the specimen around the optical axis on the horizontal plane (azimuth rotation), observing the specimen obliquely again, and reconstructing three-dimensional information with a higher degree of accuracy from two kinds of obtained data is used. That is, the experiment is carried out twice in total.

Figure 16:
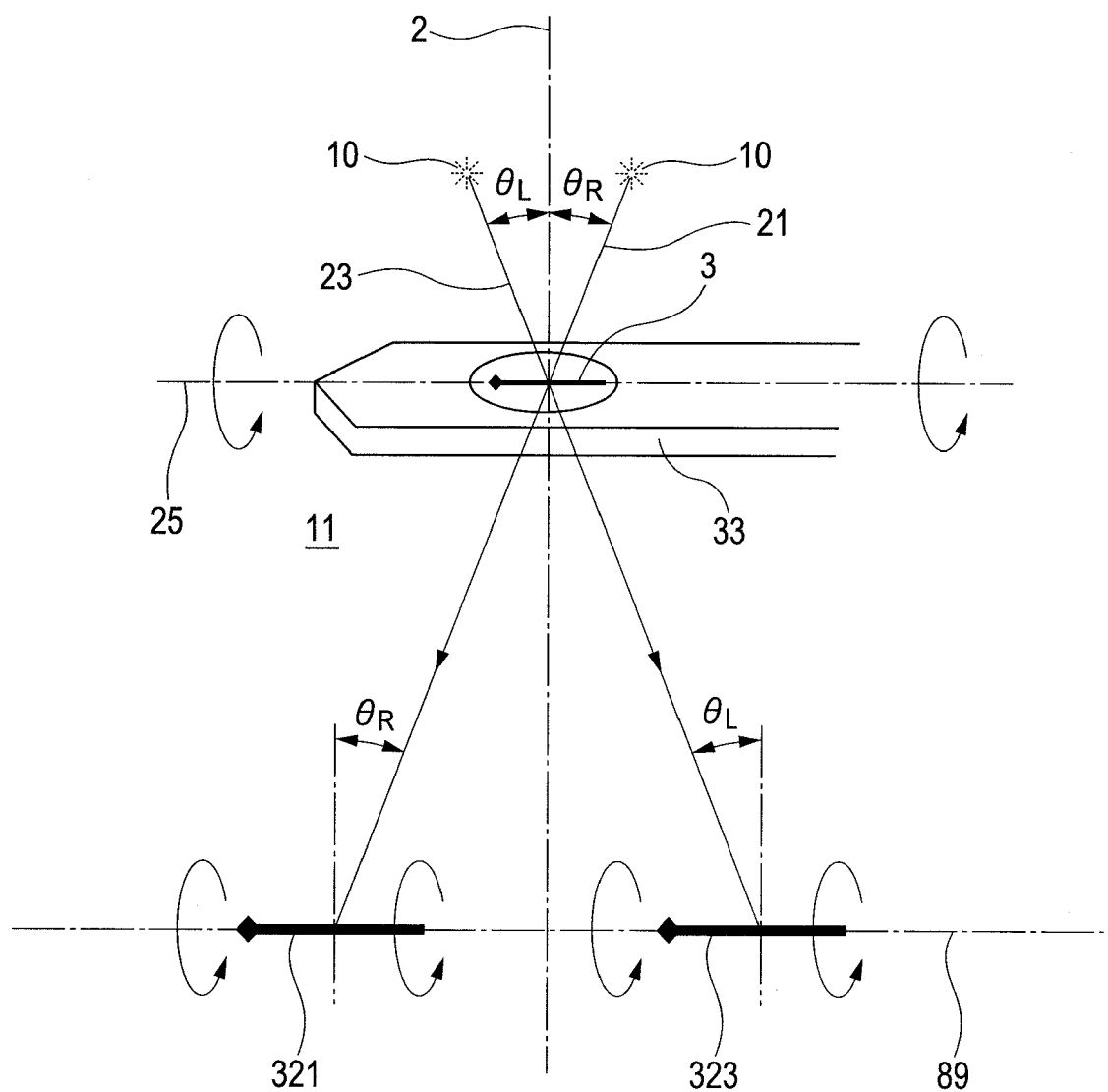
FIG. 16 is a schematic view showing an example of application to tomography according to a fourth embodiment of the present invention.

FIG. 16 is a schematic view showing an example of application to tomography according to the fourth embodiment of the present invention. The reference numeral 33 represents a specimen holder for tomography and many projection images taken by continuously inclining the specimen (for example, 151 images taken by inclining the specimen every degree up to ±75 degrees) are processed with an arithmetic processing apparatus 77 and thereby a three-dimensional structure is reconstructed.

With regard to a method of adjusting an optical system, in the flow of FIG. 13, the processing related to the control of the inclination angle of a specimen holder and the repetition of the acquisition of specimen image data at each angle is added. For example, the azimuth of an electron biprism above a specimen is adjusted so that two electron beams 21 and 23 may propagate in a plane formed by an optical axis 2 and an oblique axis 25 of the specimen holder 33, the specimen 3 is irradiated by the two electron beams 21 and 23 from two directions (irradiation angles: $\theta_R$ and $\theta_L$) as shown in FIG. 16, and two images 321 and 323 are focused on an observation record plane 89. Since the optical system conditions and the inclination of the specimen in a tomography experiment are completely independent, tomography observation is carried out under the conditions. Then, three-dimensional information is reconstructed based on the obtained two kinds of respective specimen image data. The method of reconstructing a image is the same as conventional tomography except that the irradiation angles of the electron beams are taken into consideration. Unlike the azimuth rotation of a specimen stated earlier, the inclination angle of the specimen is completely identical between two kinds of specimen image data and hence the reconstruction of three-dimensional information having a higher degree of accuracy can be realized.

Here, for the sake of simplicity in FIG. 16, all electron lenses are omitted and the specimen 3, the incoming two electron beams 21 and 23, the images 10 of the two sources acting as the sources of the electron beams, and the observed images 321 and 323 are schematically shown. The omission is based on the principle of the present invention that, if the angles of two electron beams are different from each other and thereby the angles of the two electron beams transmitting a specimen are different from each other, the respective electron beams can be observed and recorded as individual images. The optical system is the same as that shown in FIG. 4 and the configuration of the device is the same as that shown in FIG. 12. The same omission is applied also in the figures below.

Fifth Embodiment
<Application 2 to Tomography>

Figure 17:
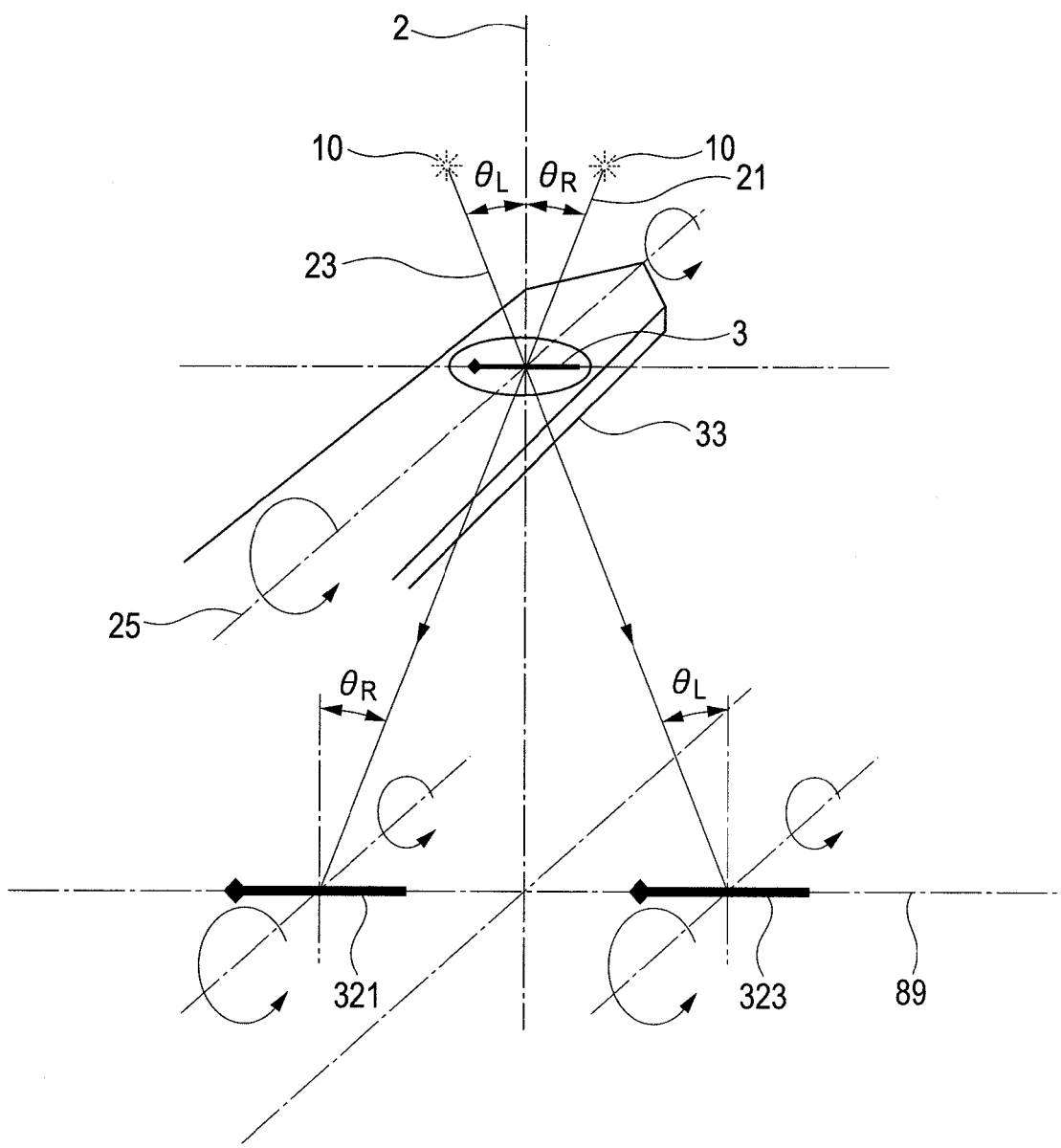
FIG. 17 is a schematic view showing an example of application to tomography according to a fifth embodiment of the present invention.

An example of application to tomography according to a fifth embodiment of the present invention is shown in FIG. 17. FIG. 17 is a schematic view in the case where the inclination axis 25 of a specimen holder 33 is different from that in the fourth embodiment by 90 degrees. In this case, two kinds of data having different irradiation azimuths are not obtained unlike the case of the fourth embodiment but tomography experiment can be carried out at an angle larger to the extent of the irradiation angle ($\theta_R$ or $\theta_L$) of the electron beam in addition to an inclination angle of a specimen 3.

Further, by adopting a condition of reducing the sum of irradiation angles $\theta_R + \theta_L$ so as to be a half of the amount of the change of the inclination angle (for example, by selecting the relationship between the irradiation angles and the change of the inclination angle so as to be $\theta_R = \ldots, -8, -4, 0, 4, 8, 12, \ldots$ and $\theta_L = -6, -2, 2, 6, 10, 14, \ldots$), the specimen images of the same number as a conventional method can be obtained in half the time of the conventional method. That is, the experiment efficiency improves and observation hardly susceptible to variation with time in an experimental system can be realized.

Meanwhile, when the change of the inclination angle is selected so that the right and left irradiation angles may coincide with each other, in the range of the inclination angle of the specimen holder 33, two specimen images are obtained from the same irradiation angle and the effects of the confirmation of reproducibility in experiment or the reduction of random noise caused by data integral can be expected.

Sixth Embodiment
<Application 1 to Lorenz Microscopy>

Figure 18:
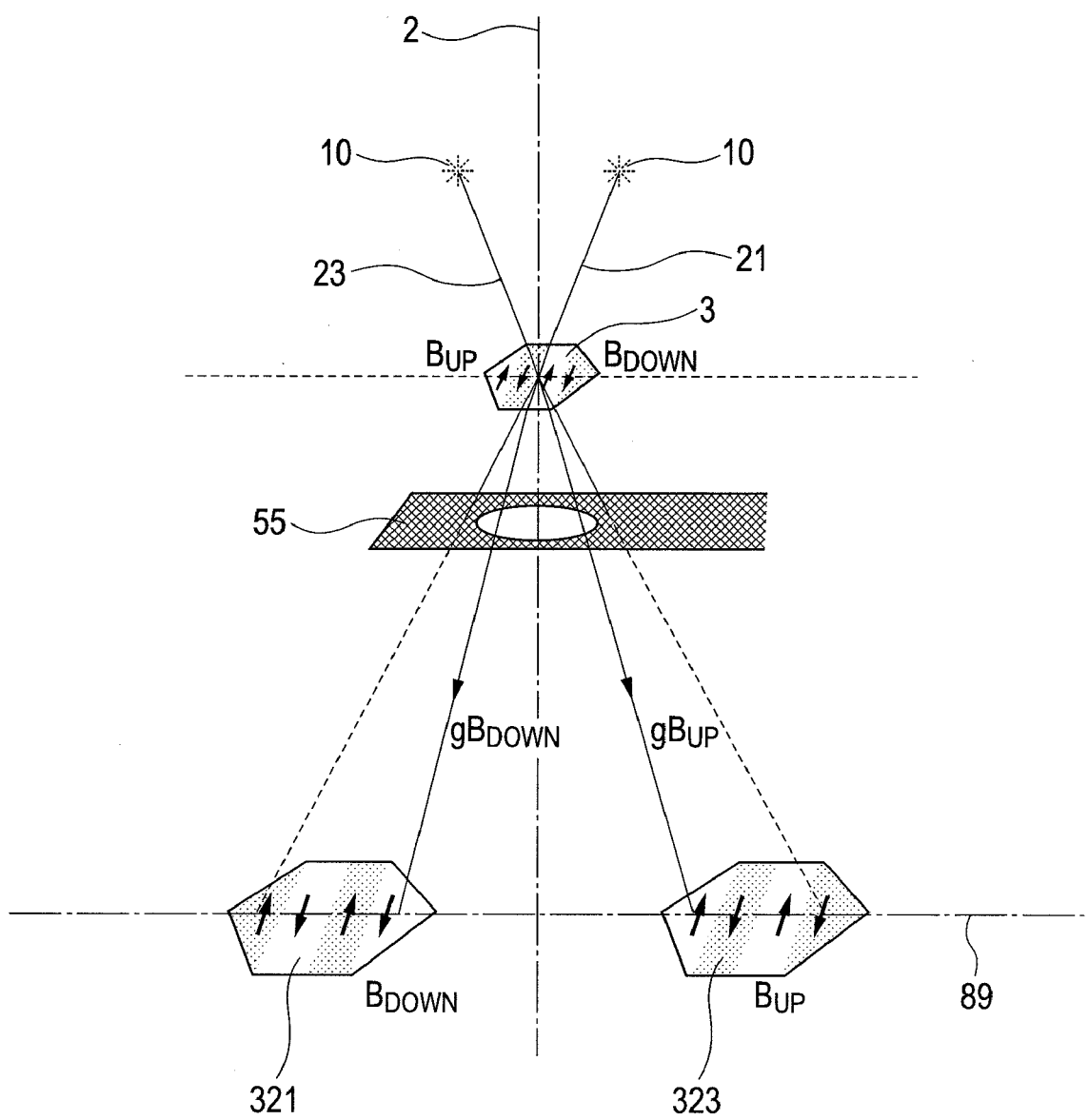
FIG. 18 is a schematic view representing a sixth embodiment (simultaneous Foucault process with two electron beams) of the present invention.

Application to a Lorenz microscope method to observe the magnetization state of a magnetic material is also possible. FIG. 18 shows, in the Lorenz microscopy, an example of application to the Foucault imaging of: selecting the component of an electron beam deflected by magnetization with an objective aperture 55; and observing a magnetic domain structure. When an observed magnetic thin film 3 shows a 180-degree inverse magnetic domain structure shown with $B_{UP}$ and $B_{Down}$ in the figure, the azimuth of an electron biprism above the specimen is selected so as to separate two electron beams in the direction vertical to the magnetization direction. Each of the electron beams, after transmitting the specimen, is separated into two electron beams ($gB_{UP}$ and $gB_{Down}$) reflecting the magnetic domain structures respectively. In Lorenz image observation by a conventional Foucault imaging, a black-and-white stripe-shaped image reflecting the magnetization directions of magnetic domains is observed by selecting with an objective aperture and expansively focusing one of the separated electron beams. The region of the black contrast represents a magnetic domain where the electron beam shielded with the objective aperture carries information and the lack of magnetization information is the source of the magnetization information. Consequently, in order to obtain information other than magnetization such as crystal defects and precipitates in the specimen, it has been necessary to: readjust the objective aperture and observe a Lorenz image of reversed contrast (the Foucault imaging); or observe an ordinary electron microscopic image.

By the present invention, as shown in FIG. 18, each of the separated electron beams (in FIG. 18, the electron beams ($gB_{UP}$ and $gB_{Down}$) having angles close to the optical axis) is selected one by one with the objective aperture 55 and expansively focused. Since the two kinds of Lorenz images 321 and 323 in the Foucault imaging that have been obtained by readjusting the objective aperture in a conventional method are observed simultaneously and individually, it is possible to obtain information such as crystal defects and precipitates in the specimen 3 with a higher degree of accuracy in real time. Here, an objective aperture having two apertures that allows a prescribed electron beam to transmit may be used as the objective aperture 55.

Seventh Embodiment
<Application 2 to Lorenz Microscopy>

Figure 19:
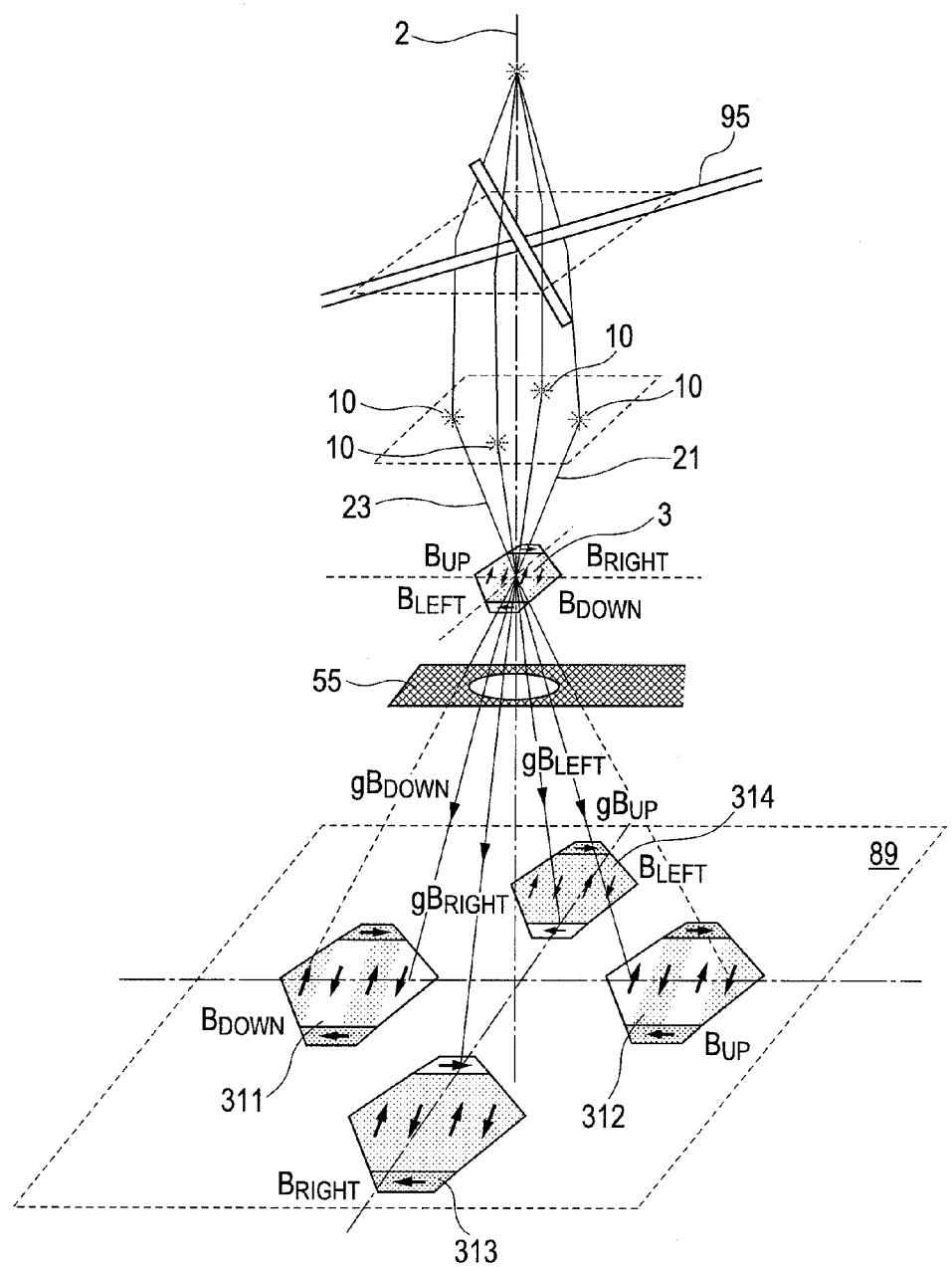
FIG. 19 is a schematic view representing a seventh embodiment (simultaneous Foucault process with four electron beams) of the present invention.

In the present invention, electron beams with which an observation region is simultaneously irradiated are not limited to a first electron beam and a second electron beam. It is possible to individually observe four orientations in a magnetic domain structure of arbitrary orientations with four electron beams likewise by further developing the sixth embodiment. A schematic view of an optical system explaining the principle is shown in FIG. 19. In the present embodiment, the center ultrafine filament electrode of a quadrangular-pyramid electron beam prism 95 disposed in a condenser optical system is used. The detail of the quadrangular-pyramid electron beam prism 95 is disclosed in FIG. 15 of JP-A-2006-313069 for example. The quadrangular-pyramid electron beam prism 95 may be disposed so that the center ultrafine filament electrode may intersect at right angles on an identical plane perpendicular to an optical axis 2 as shown in FIG. 19 or may comprise two electron biprisms configured so as to be divided into two different planes on an optical axis and be perpendicular to each other. In either of the cases, an electron beam emitted from a source is deflected with a quadrangular-pyramid electron beam prism 95 and comes to be four electron beams having different incident angles and an identical region of a specimen 3 can be irradiated simultaneously. The electron beams that have transmitted the specimen and deflected in the propagation directions by magnetic domains can individually transmit as electron beams having magnetic domain information of different magnetization directions with an objective aperture 55 the aperture size and the shape of which are appropriately set. Then with a quadrangular-pyramid electron beam prism disposed appropriately in an image forming system, it is possible to focus specimen images respectively reflecting different kinds of magnetic domain information (the downward magnetic domain image 311 of the specimen, the upward magnetic domain image 312 of the specimen, the rightward magnetic domain image 313 of the specimen, and the leftward magnetic domain image 314 of the specimen shown in FIG. 19) on an observation record plane 89. That is, it is possible to simultaneously observe the magnetization information of a magnetic material specimen in every orientation without exception.

Eighth Embodiment

<Simultaneous Observation of Bright Field Image and Dark Field Image>

Figure 20:
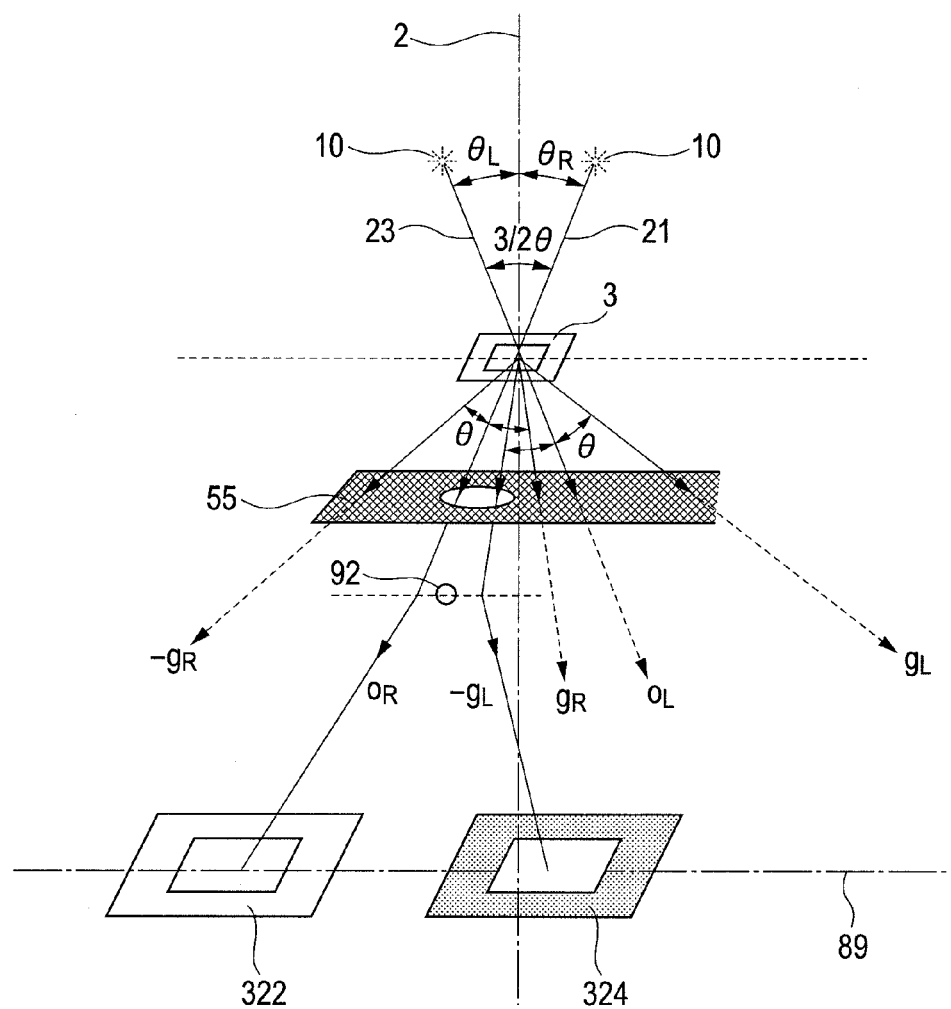
FIG. 20 is a schematic view representing an eighth embodiment (simultaneous observation of a bright field image and a dark field image) of the present invention.

The present invention makes it possible to simultaneously observe both an observation image (a bright field image 322) formed only with a transmission electron beam and an observation image (a dark field image 324) formed only with a scattered (diffracted) electron beam. An example in the case where the sum of irradiation angles $\theta_R+\theta_L$ is $3/2\theta$ is shown in FIG. 20. Here, $\theta$ represents a diffraction angle and $g_R$ and $g_L$ in the figure represent diffracted electron beams. By selecting the size of the hole and the installation location of the aperture of an objective aperture 55 disposed between a specimen 3 and a second electron biprism 92 on an optical axis so that a transmitted wave $O_R$ and a diffracted wave $-g_L$ may transmit, it is possible to simultaneously observe the bright field image 322 and the dark field image 324.

The present invention further makes it possible to observe two different diffracted waves (for example, two dark field images of $-g_L$ and $g_R$ when an objective aperture 55 is inserted symmetrically onto an optical axis 2 in FIG. 20) by selecting the location of the objective aperture although it is not shown in the figure.

The present invention is applicable not only to a diffracted wave but also to a dark field image caused by an electron beam of a small scatter angle. On this occasion, although the region of shadow caused by a first electron biprism reduces, the present invention can be applied by appropriately selecting the location where a second electron biprism 92 is inserted and the size of the center ultrafine filament electrode of the second electron biprism. FIG. 20 schematically shows the state of inserting a second electron biprism 92 and completely spatially separating a bright field image 322 and a dark field image 324 on an observation record plane 89. In the case of the observation of a crystalline specimen, the observation can be carried out as long as the sum of irradiation angles $\theta_R+\theta_L$ satisfies the expression $\theta<\theta_R+\theta_L<2\theta$ when a diffraction angle is defined as $\theta$. This is not applied provided, however, that a stop of two apertures or a stop of an aperture having a shape other than a round shape is used as an objective aperture.

What is claimed is:

1. A transmission electron microscope comprising:
    a source for an electron beam;
    a condenser optical system that irradiates a specimen with an electron beam emitted from the source;
    a specimen holding unit that holds the specimen to be irradiated by the electron beam;
    an imaging lens system that focuses an image of the specimen;
    at least one detecting unit that obtains the image of the specimen formed by the imaging lens system;
    a first electron biprism disposed on the upstream side of the location where the specimen is placed in the electron beam traveling direction on the optical axis of an electron optical system of the transmission electron microscope; and
    a second electron biprism disposed on the downstream side of the location where the specimen is placed in the electron beam traveling direction on the optical axis of the electron optical system and set in a space at the shadow of the electron beam produced by the first electron biprism,
    wherein the first electron biprism deflects the electron beam emitted from the source and separates the electron beam into a first electron beam and a second electron beam for irradiating a prescribed region of the specimen from different angles,
    wherein the second electron biprism deflects the first electron beam and the second electron beam having transmitted the specimen and spatially separates a first image of the specimen produced by the first electron beam with a second image of the specimen produced by the second electron beam, and
    wherein the detecting unit obtains the first image and the second image.

2. The transmission electron microscope according to claim 1, further comprising:
    a processing device that computes the shape of the specimen from the specimen images obtained by the detecting unit; and
    a display device that displays the shape of the specimen computed by the processing device.

3. The transmission electron microscope according to claim 2,
    wherein the processing device has the function of computing a three-dimensional shape of the specimen from the first and second images corresponding to a right visual field image and a left visual field image of the specimen; and
    wherein the three-dimensional shape of the specimen computed by the processing device is displayed on the display device.

4. The transmission electron microscope according to claim 1,
    wherein positive voltage is applied to a central ultrafine filament electrode of the first electron biprism and negative voltage is applied to the second electron biprism.

5. The transmission electron microscope according to claim 1, further comprising:
    a control unit of the first electron biprism that deflects an electron beam emitted from the source and separates the electron beam into the first electron beam and the second electron beam based on the relation of the expression $\alpha=kV_f$, when a voltage applied to the central ultrafine filament electrode of the first electron biprism is represented by $V_f$, a deflection factor is represented by k, and the deflection angle of an electron beam caused by the electron biprism is represented by $\alpha$.

6. The transmission electron microscope according to claim 1, further comprising:
    a control unit of the second electron biprism that deflects and spatially separates the first electron beam and the second electron beam having transmitted the specimen based on the relation of the expression $\alpha=kV_f$, when a voltage applied to the central ultrafine filament electrode of the second electron biprism is represented by $V_f$, a deflection factor is represented by k, and the deflection angle of an electron beam caused by the electron biprism is represented by $\alpha$.

7. The transmission electron microscope according to claim 1, wherein the first electron biprism is disposed on the principal plane of a condenser lens in the condenser optical system.

8. The transmission electron microscope according to claim 1, wherein the first electron biprism is disposed on the upstream side of a condenser lens in the condenser optical system in the electron beam traveling direction.

9. The transmission electron microscope according to claim 1, wherein the first electron biprism is disposed on the downstream side of a condenser lens in the condenser optical system in the electron beam traveling direction.

10. The transmission electron microscope according to claim 7, wherein a condenser aperture is disposed on the principal plane of the condenser lens in the condenser optical system and a central ultrafine filament electrode of the first electron biprism is disposed in the center of a hole of the condenser aperture.

11. The transmission electron microscope according to claim 3,
wherein the specimen holding unit is a specimen holder for tomography; and
wherein the processing device reconstructs a three-dimensional structure of the specimen from a plurality of projection images taken by continuously inclining the specimen, and displays the three-dimensional structure on the display device.

12. A transmission electron microscope comprising:
a source for an electron beam;
a condenser optical system that irradiates a specimen with an electron beam emitted from the source;
a specimen holding unit that holds the specimen to be irradiated by the electron beam;
an imaging lens system that focuses an image of the specimen;
at least one detecting unit that obtains the image of the specimen formed by the imaging lens system;
a first electron biprism disposed on the upstream side of the location where the specimen is placed in the electron beam traveling direction on the optical axis of an electron optical system of the transmission electron microscope;
a third electron biprism disposed on the downstream side of the first electron biprism in the electron beam traveling direction on the optical axis of the electron optical system through one or plural lenses belonging to the condenser optical system and on the upstream side of the location where the specimen is placed in the electron beam traveling direction and set in a space at the shadow of the electron beam produced by the first electron biprism; and
a second electron biprism disposed on the downstream side of the location where the specimen is placed in the electron beam traveling direction on the optical axis of the electron optical system and set in a space at the shadow of the electron beam produced by the first electron biprism,
wherein the first electron biprism and the third electron biprism deflect the electron beam emitted from the source and separate the electron beam into a first electron beam with a second electron beam so as to propagate in different directions for irradiating a prescribed region of the specimen from different angles,
wherein the second electron biprism deflects the first electron beam and the second electron beam having transmitted the specimen and thereby separates a first image of the specimen produced with the first electron beam with a second image of the specimen produced with the second electron beam, and
wherein the detecting unit obtains the first image and the second image.

13. The transmission electron microscope according to claim 12, further comprising:
a processing device that computes the shape of a specimen from plural specimen images; and
a display device that displays the shape of the specimen computed by the processing device.

14. The transmission electron microscope according to claim 12, further comprising:
a processing device that computes a three-dimensional shape of a specimen from plural specimen images; and
a display device that displays the three-dimensional shape of the specimen computed by the processing device,
wherein the plural images for computing the three-dimensional shape are the first image and the second image of the specimen corresponding to a right visual field image and a left visual field image of the specimen.

15. The transmission electron microscope according to claim 12, further comprising:
a fourth electron biprism for obtaining an interferogram disposes on the downstream side of an objective lens constituting the imaging lens system and on the upstream side of an image formed by the objective lens.

16. A method for observing a specimen image by using a transmission electron microscope having a source for an electron beam, a condenser optical system that irradiates a specimen with an electron beam emitted from the source; a specimen holding unit that holds the specimen to be irradiated by the electron beam; an imaging lens system that focuses an image of the specimen; at least one detecting unit that obtains the image of the specimen formed by the imaging lens system; a processing device that computes the shape of the specimen from plural specimen images, and a display device, the method comprising:
generating an electron beam from the source;
deflecting the electron beam by a first electron biprism disposed in the condenser optical system, thereby separating the electron beam into two electron beams of different angles, and irradiating a prescribed region of the specimen simultaneously from the different angles;
spatially separating the two electron beams of different irradiation angles having simultaneously transmitted the specimen by a second electron biprism disposed in the imaging lens system, focusing images individually, and obtaining two specimen images by the detecting unit; and
displaying a image computed from the two specimen images on the display device.

17. The method for observing a specimen image by using a transmission electron microscope according to claim 16, further comprising:
reconstructing a three-dimensional shape of the specimen from the two specimen images of different irradiation angles and displaying the three-dimensional shape on the display device.

18. The method for observing a specimen image by using a transmission electron microscope according to claim 16, further comprising:
forming the two specimen images of different irradiation angles and displaying them at different locations on the display device.

19. The method for observing a specimen image by using a transmission electron microscope according to claim 16, the transmission electron microscope having an objective aperture disposed on the downstream side of the location where the specimen is placed in the electron beam traveling direction on the optical axis of an electron optical system of the transmission electron microscope;

the method further comprising:

forming two micrographs based on a bright field image of the specimen formed only with a transmitted electron beam and a dark field image of the specimen formed only with a scattered electron beam or a diffracted electron beam, and displaying the two images on the display device.

20. The method for observing a specimen image by using a transmission electron microscope according to claim 16, the first electron biprism being disposed on the upstream side of the location where the specimen is placed in the electron beam traveling direction on the optical axis of an electron optical system of the transmission electron microscope; and the second electron biprism being disposed on the downstream side of the location where the specimen is placed in the electron beam traveling direction on the optical axis of the electron optical system and set in a space at the shadow of the electron beam produced by the first electron biprism, the method further comprising:

deflecting an electron beam emitted from the source by the first electron biprism, separating the electron beam into a first electron beam and a second electron beam, and simultaneously irradiating a prescribed region of the specimen from different angles;

deflecting the first electron beam and the second electron beam having transmitted the specimen by the second electron biprism, spatially separates a first image of the specimen produced with the first electron beam and a second image of the specimen produced with the second electron beam;

obtaining the first image and the second image corresponding to a right visual field image and a left visual field image of the specimen by the detecting unit; and displaying an image computed from the first image and the second image of the specimen on the display device.

\* \* \* \* \*